United States Patent [19]

Terashima

[11] Patent Number: 5,309,002
[45] Date of Patent: May 3, 1994

[54] SEMICONDUCTOR DEVICE WITH PROTRUDING PORTION

[75] Inventor: Tomohide Terashima, Fukuoka, Japan

[73] Assignee: Mitsubishi Denki Kabushiki Kaisha, Tokyo, Japan

[21] Appl. No.: 21,462

[22] Filed: Feb. 23, 1993

[30] Foreign Application Priority Data

Mar. 30, 1992 [JP] Japan .................. 4-073709

[51] Int. Cl.$^5$ .......................................... H01L 29/00
[52] U.S. Cl. ............................... 257/130; 257/155; 257/172; 257/331; 257/914
[58] Field of Search ............ 257/172, 138, 144, 130, 257/149, 496, 329, 328, 330, 331, 332, 333, 334, 129, 152, 153, 170, 171, 172, 164, 155, 6, 914

[56] References Cited

U.S. PATENT DOCUMENTS

| | | | |
|---|---|---|---|
| 4,772,926 | 9/1988 | Nishizawa et al. | 257/170 X |
| 4,841,345 | 6/1989 | Majumdar | 257/149 X |
| 4,862,239 | 8/1989 | Broich et al. | 257/170 X |
| 4,963,950 | 10/1990 | Chang et al. | 257/138 |
| 5,091,766 | 2/1992 | Terashima | 257/138 |
| 5,155,569 | 10/1992 | Terashima | 257/130 |
| 5,194,394 | 3/1993 | Terashima | 437/6 |

FOREIGN PATENT DOCUMENTS

| | | | |
|---|---|---|---|
| 54-105984 | 8/1979 | Japan | 257/138 |
| 62-219667 | 9/1987 | Japan . | |
| 2-10874 | 1/1990 | Japan . | |

*Primary Examiner*—William Mintel
*Attorney, Agent, or Firm*—Oblon, Spivak, McClelland, Maier & Neustadt

[57] ABSTRACT

Between electrodes (9) and (10) are formed a p$^+$ substrate (2), an n$^-$ epitaxial layer (1) having a protruding portion (3), an n$^+$ diffusion region (4) and p$^+$ diffusion regions (13). Control electrodes (6) are formed on insulating films (5) on opposite sides of the protruding portion (3) and n$^+$ diffusion region (4). The potential at the control electrodes (6) is increased or decreased with the potential at an electrode (10) increased relative to an electrode (9) to generate potential barrier or conductivity modulation in the n$^-$ epitaxial layer (1), whereby a semiconductor device turns off or on. Introduced holes are drawn through the p$^+$ diffusion regions (13) when the semiconductor device turns off, to provide a small resistance and a short distance when the holes are drawn without changes in the area of the n$^+$ diffusion region (4). This permits the semiconductor device to have small switching loss and high switching speed with a low ON-voltage.

18 Claims, 35 Drawing Sheets

SEMICONDUCTOR DEVICE WITH PROTRUDING PORTION

BACKGROUND OF THE INVENTION

1. Field of the Invention

The present invention relates to a semiconductor device operated by the voltage of a control electrode and more particularly to techniques for improving operating characteristics of the semiconductor device.

2. Description of the Background Art

FIG. 30 is a plan view of a conventional semiconductor device. FIG. 31 is a perspective cross-sectional view thereof taken along the line X—X of FIG. 30. For ease of understanding of the cross-sectional structure, parts of control electrodes and the like are not illustrated in FIG. 31. Reference numeral 1 designates an n$^-$ epitaxial layer; 2 designates a p$^+$ substrate; 3 designates a protruding portion formed on the surface of the n$^-$ epitaxial layer 1; 4 designates an n$^+$ diffusion region formed on the upper surface of the protruding portion 3; 5 designates insulating films formed on the side faces of the protruding portion 3 and n$^+$ diffusion region 4; 6 designates a pair of control electrodes formed on the insulating films 5 on opposite sides of the protruding portion 3 and n$^+$ diffusion region 4; 7 designates a p$^+$ diffusion region formed in the n$^-$ epitaxial layer 1 at the end of the n$^+$ diffusion region 4; 8 designates an insulating film formed on part of the p$^+$ diffusion region 7, part of the n$^+$ diffusion region 4 and control electrodes 6; 9 designates an Al-Si electrode formed in contact with the diffusion regions 4 and 7 and isolated from the other portions by the insulating film 8; and 10 designates a metal electrode contacting the p$^+$ substrate 2.

The operation of the conventional semiconductor device will be described below with reference to FIGS. 32 to 34. As the potential at the control electrodes 6 relative to the electrode 9 is decreased with the potential at the electrode 10 relative to the electrode 9 increased, depletion layers extending from the control electrodes 6 come into contact with each other to generate potential barrier in the protruding portion 3 of the n$^-$ epitaxial layer 1 which lies between the control electrodes 6 as shown in FIG. 32. This prevents electrons from flowing from the electrode 9 toward the electrode 10. Thus current is interrupted.

As the potential at the control electrodes 6 relative to the electrode 9 is increased, the potential barrier disappears and electrons 12 start flowing from the electrode 9 toward the electrode 10. Simultaneously, holes 11 are introduced from the p$^+$ substrate 2 to cause conductivity modulation in the n$^-$ epitaxial layer 1. As shown in FIG. 33, the introduced holes 11 are joined to the electrons again in the n$^-$ epitaxial layer 1 or n$^+$ diffusion region 4 or they are absorbed into the p$^+$ diffusion region 7. Thus the semiconductor device turns on.

As the potential at the control electrodes 6 relative to the electrode 9 is decreased again, the potential barrier is generated again in the protruding portion 3 between the control electrodes 6, so that electronic current tends to stop flowing from the electrode 9 toward the electrode 10. Simultaneously, the introduced holes 11 travel along the surface of the insulating layers 5 in such a manner that they accumulate on the surface thereof to be commutated into the p$^+$ diffusion region 7, as shown in FIG. 34. Thus the semiconductor device turns off.

The conventional semiconductor device thus constructed has problems to be described below. As the area of the n$^+$ diffusion region 4 is increased relative to the p$^+$ diffusion region 7 for reduction in ON-voltage, it takes longer to commutate the holes 11 when the semiconductor device turns off, resulting in reduction in switching speed and increase in switching loss.

On the other hand, as the area of the n$^+$ diffusion region 4 is decreased relative to the p$^+$ diffusion region 7, the switching speed and switching loss are improved. However, this causes a large number of holes introduced when the semiconductor device is on to be commutated into the p$^+$ diffusion region 7, so that the n$^-$ epitaxial layer 1 adjacent the n$^+$ diffusion region 4 is not sufficiently subjected to the conductivity modulation, resulting in increase in ON-voltage.

The conventional semiconductor device is disadvantageous in that the ON-voltage is in traded-off relation to the switching speed and switching loss so that it is difficult to simultaneously improve both of them.

SUMMARY OF THE INVENTION

According to the present invention, a semiconductor device comprises: a first semiconductor layer of a first conductivity type having first and second major surfaces, a second semiconductor layer of a second conductivity type formed on the first major surface of the first semiconductor layer, the first semiconductor layer including a protruding portion selectively formed on the second major surface, a first semiconductor region of the first conductivity type formed on the upper surface of the protruding portion and having a resistance lower than that of the first semiconductor layer, a first insulating film formed on one side face of the protruding portion of the first semiconductor layer and the first semiconductor region, a first control electrode formed on the first insulating film, a second insulating film formed on the other side face of the protruding portion and the first semiconductor region opposed to the one side face, a second control electrode formed on the second insulating film, a second semiconductor region of the second conductivity type selectively formed in contact with the first insulating film in a surface of the first semiconductor region, a third semiconductor region of the second conductivity type selectively formed in contact with the second insulating film in the surface of the first semiconductor region, a first main electrode formed in contact with the first, second and third semiconductor regions independently of the first and second control electrodes, and a second main electrode formed in contact with the second semiconductor layer.

The semiconductor device comprises the second and third semiconductor regions of the second conductivity type which function to draw introduced carriers through the inverted layers formed in the first semiconductor region when the semiconductor device turns off. This provides for a small resistance when the carriers are drawn and a short distance the drawn carriers travel, to achieve small switching loss and high switching speed. Since the whole first semiconductor region is used for turning on and off, the ON-voltage is prevented from increasing. The semiconductor device achieves the reduction in switching loss and increase in switching speed and the reduction in ON-voltage which have been in traded-off relation.

In another aspect of the present invention, a semiconductor device comprises: a first semiconductor layer of a first conductivity type having first and second major surfaces, a second semiconductor layer of a second conductivity type formed on the first major surface of the first semiconductor layer, the first semiconductor layer including a protruding portion selectively formed on the second major surface, a first semiconductor region of the first conductivity type formed on the upper surface of the protruding portion and having a resistance lower than that of the first semiconductor layer, a first insulating film formed on one side face of the protruding portion of the first semiconductor layer and the first semiconductor region, a first control electrode formed on the first insulating film, a second insulating film formed on the other side face of the protruding portion and the first semiconductor region opposed to the one side face, a second control electrode formed on the second insulating film, a second semiconductor region of the second conductivity type selectively formed in a surface of the first semiconductor region in contact with the first and second insulating films and including a plurality of independent regions spaced apart from each other along the first and second insulating films, a first main electrode formed in contact with the first and second semiconductor regions independently of the first and second control electrodes, and a second main electrode formed in contact with the second semiconductor layer.

The semiconductor device comprises the second semiconductor region of the second conductivity type which functions to draw introduced carriers through the inverted layers formed in the first semiconductor region when the semiconductor device turns off. This provides for a small resistance when the carriers are drawn and a short distance the drawn carriers travel, to achieve small switching loss and high switching speed. Since the whole first semiconductor region is used for turning on and off, the ON-voltage is prevented from increasing. The semiconductor device achieves the reduction in switching loss and increase in switching speed and the reduction in ON-voltage which have been in traded-off relation. The protruding portion is permitted to be made narrower, to provide higher turn-off speed and smaller turn-off loss.

In still another aspect of the present invention, a semiconductor device comprises: a first semiconductor layer of a first conductivity type having first and second major surfaces, a second semiconductor layer of a second conductivity type formed on the first major surface of the first semiconductor layer, a first semiconductor region of the second conductivity type selectively formed on the second major surface of the first semiconductor layer, a second semiconductor region of the first conductivity type selectively formed on a surface of the first semiconductor region and having a resistance lower than that of the first semiconductor layer, a first insulating film formed on one side face of the first and second semiconductor regions, a first control electrode formed on the first insulating film, a second insulating film formed on the other side face of the first and second semiconductor regions opposed to the one side face, a second control electrode formed on the second insulating film, a third semiconductor region of the second conductivity type selectively formed in contact with the first insulating film on a surface of the second semiconductor region, a fourth semiconductor region of the second conductivity type selectively formed in contact with the second insulating film on the surface of the second semiconductor region, a first main electrode formed in contact with the second, third and fourth semiconductor regions independently of the first and second control electrodes, and a second main electrode formed in contact with the second semiconductor layer.

The semiconductor device comprises the third and fourth semiconductor regions of the second conductivity type which function to draw introduced carriers through the inverted layers formed in the second semiconductor region when the semiconductor device turns off. This provides for a small resistance when the carriers are drawn and a short distance the drawn carriers travel, to achieve small switching loss and high switching speed. Since the whole second semiconductor region is used for turning on and off, the ON-voltage is prevented from increasing. The semiconductor device achieves the reduction in switching loss and increase in switching speed and the reduction in ON-voltage which have been in traded-off relation.

The semiconductor device further comprises the first semiconductor region of the second conductivity type. Since the breakdown voltage is held directly between the first semiconductor region of the second conductivity type and the first semiconductor layer of the first conductivity type, the thickness of the semiconductor device is decreased. By controlling the impurity concentration of the first semiconductor region, the semiconductor device is permitted to turn off without biasing the first and second control electrodes.

In a further aspect of the present invention, a semiconductor device comprises: a first semiconductor layer of a first conductivity type having first and second major surfaces, a second semiconductor layer of a second conductivity type formed on the first major surface of the first semiconductor layer, a first semiconductor region of the second conductivity type selectively formed on the second major surface of the first semiconductor layer, a second semiconductor region of the first conductivity type selectively formed on a surface of the first semiconductor region and having a resistance lower than that of the first semiconductor layer, a first insulating film formed on one side face of the first and second semiconductor regions, a first control electrode formed on the first insulating film, a second insulating film formed on the other side face of the first and second semiconductor regions opposed to the one side face, a second control electrode formed on the second insulating film, a third semiconductor region of the second conductivity type selectively formed in a surface of the second semiconductor region in contact with the first and second insulating films and including a plurality of independent regions spaced apart from each other along the first and second insulating films, a first main electrode formed in contact with the second and third semiconductor regions independently of the first and second control electrodes, and a second main electrode formed in contact with the second semiconductor layer.

The semiconductor device comprises the third semiconductor region of the second conductivity type which functions to draw introduced carriers through the inverted layers formed in the second semiconductor region when the semiconductor device turns off. This provides for a small resistance when the carriers are drawn and a short distance the drawn carriers travel, to achieve small switching loss and high switching speed. Since the whole second semiconductor region is used for turning on and off, the ON-voltage is prevented from increasing. The semiconductor device achieves the reduction in switching loss and increase in switching speed and the reduction in ON-voltage which have been in traded-off relation. Increase in spacing between the first and second control electrodes permits higher turn-off speed and smaller turn-off loss.

The semiconductor device further comprises the first semiconductor region of the second conductivity type. Since the breakdown voltage is held directly between the first semiconductor region of the second conductivity type and the first semiconductor layer of the first conductivity type, the thickness of the semiconductor device is decreased. By controlling the impurity concentration of the first semiconductor region, the semiconductor device is permitted to turn off without biasing the first and second control electrodes.

The present invention is also directed to a method of fabricating a semiconductor device. According to the present invention, the method comprises the steps of: (a) providing a first semiconductor layer of a first conductivity type having first and second major surfaces to form a second semiconductor layer of a second conductivity type on the first major surface of the first semiconductor layer, (b) selectively forming a protruding portion on the second major surface of the first semiconductor layer, (c) selectively forming a first semiconductor region of the first conductivity type having a resistance lower than that of the first semiconductor layer on the upper surface of the protruding portion of the first semiconductor layer, (d) forming a first insulating film on one side face of the protruding portion of the first semiconductor layer and the first semiconductor region, (e) forming a first control electrode on the first insulating film, (f) forming a second insulating film on the other side face of the protruding portion and the first semiconductor region opposed to the one side face, (g) forming a second electrode on the second insulating film, (h) selectively forming a second semiconductor region of the second conductivity type on a surface of the first semiconductor region in contact with the first insulating film, (i) selectively forming a third semiconductor region of the second conductivity type on the surface of the first semiconductor region in contact with the second insulating film, (j) forming a first main electrode independently of the first and second control electrodes in contact with the first, second and third semiconductor regions, and (k) forming a second main electrode in contact with the second semiconductor layer.

Since the method comprises the step of selectively forming the second semiconductor region of the second conductivity type on the surface of the first semiconductor region in contact with the first insulating film and the step of selectively forming the third semiconductor region of the second conductivity type on the surface of the first semiconductor region in contact with the second insulating film, the second and third semiconductor regions are easily formed, so that the semiconductor device of the present invention is fabricated without difficulty.

Preferably, the combination of the steps (b), (c), (h) and (i) include the steps of selectively diffusing an impurity of the first conductivity type into the second major surface of the first semiconductor layer to form the first semiconductor region having the resistance lower than that of the first semiconductor layer, selectively diffusing an impurity of the second conductivity type into the surface of the first semiconductor region to simultaneously form the second and third semiconductor regions, and selectively, simultaneously etching the first, second and third semiconductor regions and the first semiconductor layer to form a pair of trenches such that the first, second and third semiconductor regions and the first semiconductor layer protrude. The combination of the steps (d) and (f) include the step of forming an insulating film on the surface of the pair of trenches to simultaneously form the first and second insulating films. The combination of the steps (e) and (g) include the step of forming an electric conductor in the pair of trenches on which the insulating film is formed to simultaneously form the first and second control electrodes.

Since the method comprises the step of selectively diffusing the impurity of the second conductivity type into the surface of the first semiconductor region to simultaneously form the second and third semiconductor regions, the second and third semiconductor regions are easily formed, so that the semiconductor device of the present invention is fabricated without difficulty.

An object of the present invention is to provide a semiconductor device having a low ON-voltage, a high switching speed and small switching loss.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view of the semiconductor device of the first preferred embodiment when it turns on;

FIG. 7 is a cross-sectional view of the semiconductor device of the second preferred embodiment when it turns on;

FIG. 33 is a perspective cross-sectional view of the conventional semiconductor device when it turns on;

DESCRIPTION OF THE PREFERRED EMBODIMENTS

Figure 1:
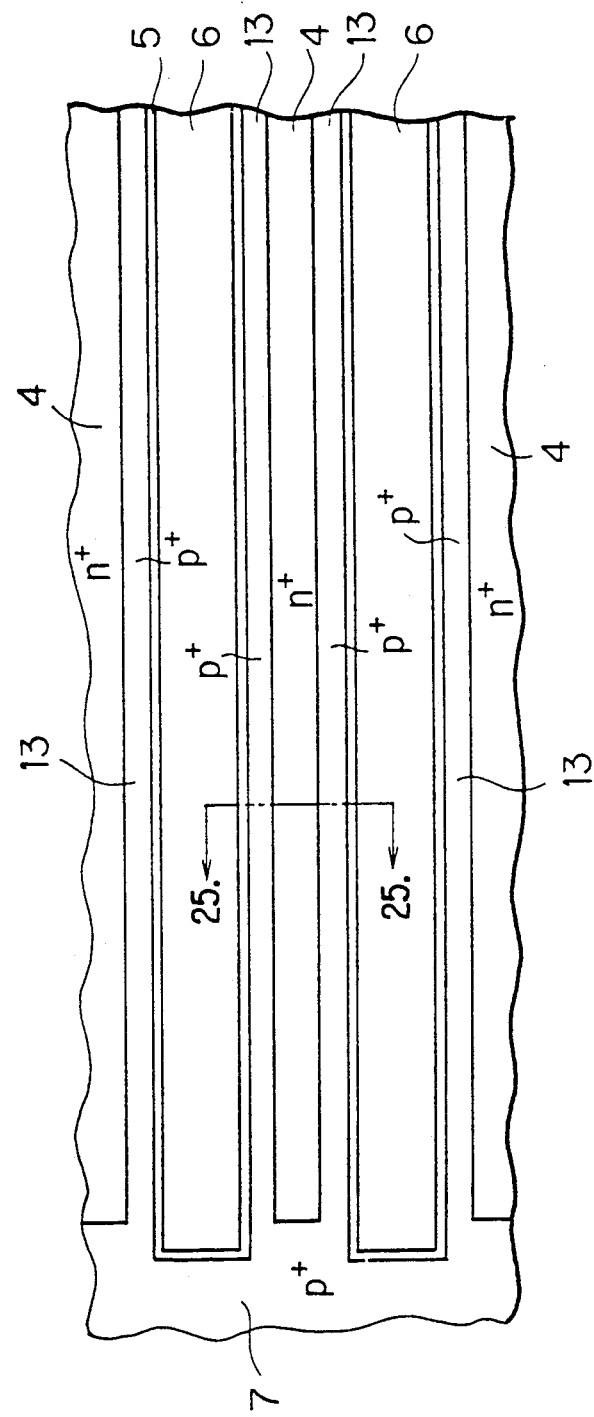
FIG. 1 is a plan view of a semiconductor device of a first preferred embodiment according to the present invention.
Figure 2:
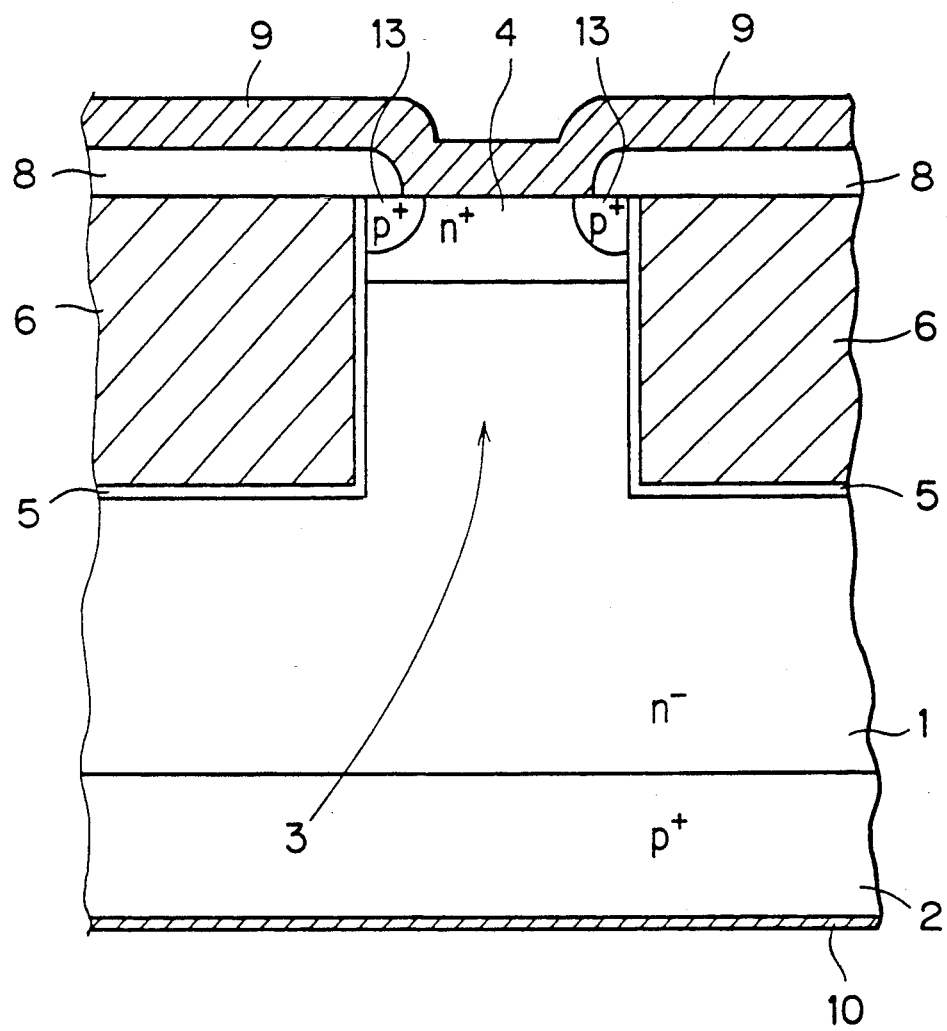
FIG. 2 is a cross-sectional view taken along the line Y—Y of FIG. 1.

Referring to FIGS. 1 to 5, a description will be given hereinafter on a first preferred embodiment according to the present invention. FIGS. 1 and 2 are plan and cross-sectional views of a semiconductor device of the first preferred embodiment according to the present invention, respectively. Reference numeral 1 designates an n$^-$ epitaxial layer; 2 designates a p$^+$ substrate; 3 designates a protruding portion formed on the surface of the n$^-$ epitaxial layer 1; 4 designates an n$^+$ diffusion region formed on the upper surface of the protruding portion 3; 5 designates insulating films formed on the upper surface of the n$^-$ epitaxial layer 1 and on both side faces of the protruding portion 3 and n$^+$ diffusion region 4; 6 designates a pair of gate electrodes formed on opposite sides of the protruding portion 3; 8 designates insulating films; 7 designates a p$^+$ diffusion region formed at the end of the n$^+$ diffusion region 4; 13 designates p$^+$ diffusion regions formed in contact with the insulating films 5 in the surface of the n$^+$ diffusion region 4; 9 designates an Al-Si electrode formed in contact with the n$^+$ diffusion region 4 and p$^+$ diffusion regions 13; and 10 designates a metal electrode contacting the p$^+$ substrate 2. For ease of understanding of the structure of the present invention, the electrode 9 and insulating films 8 are not illustrated in the plan view of FIG. 1 but are illustrated in the cross-section of FIG. 2 taken along the line Y—Y of FIG. 1.

Figure 3:
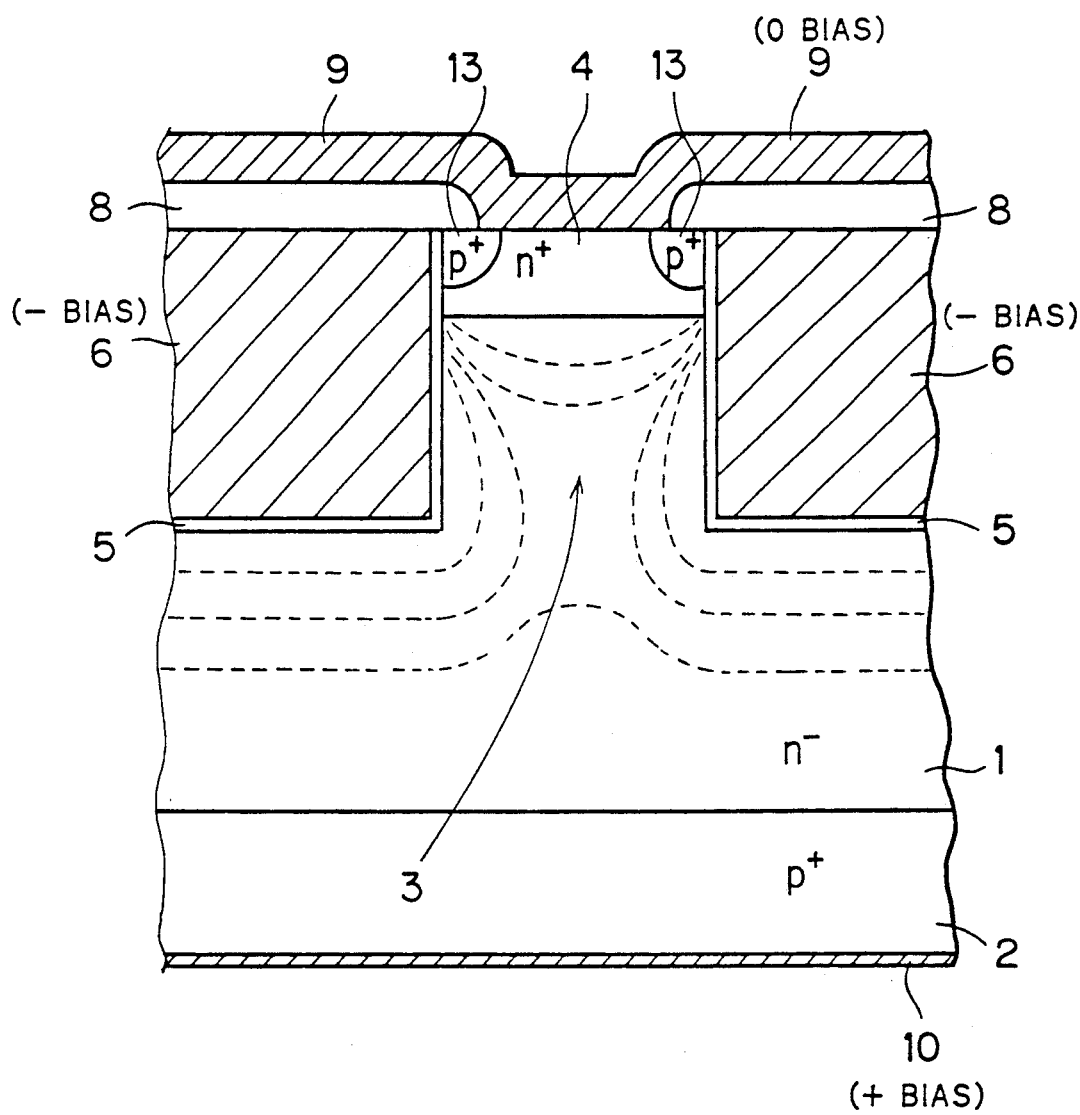
FIG. 3 is a cross-sectional view showing current interruption state in the semiconductor device of the first preferred embodiment.
Figure 4:
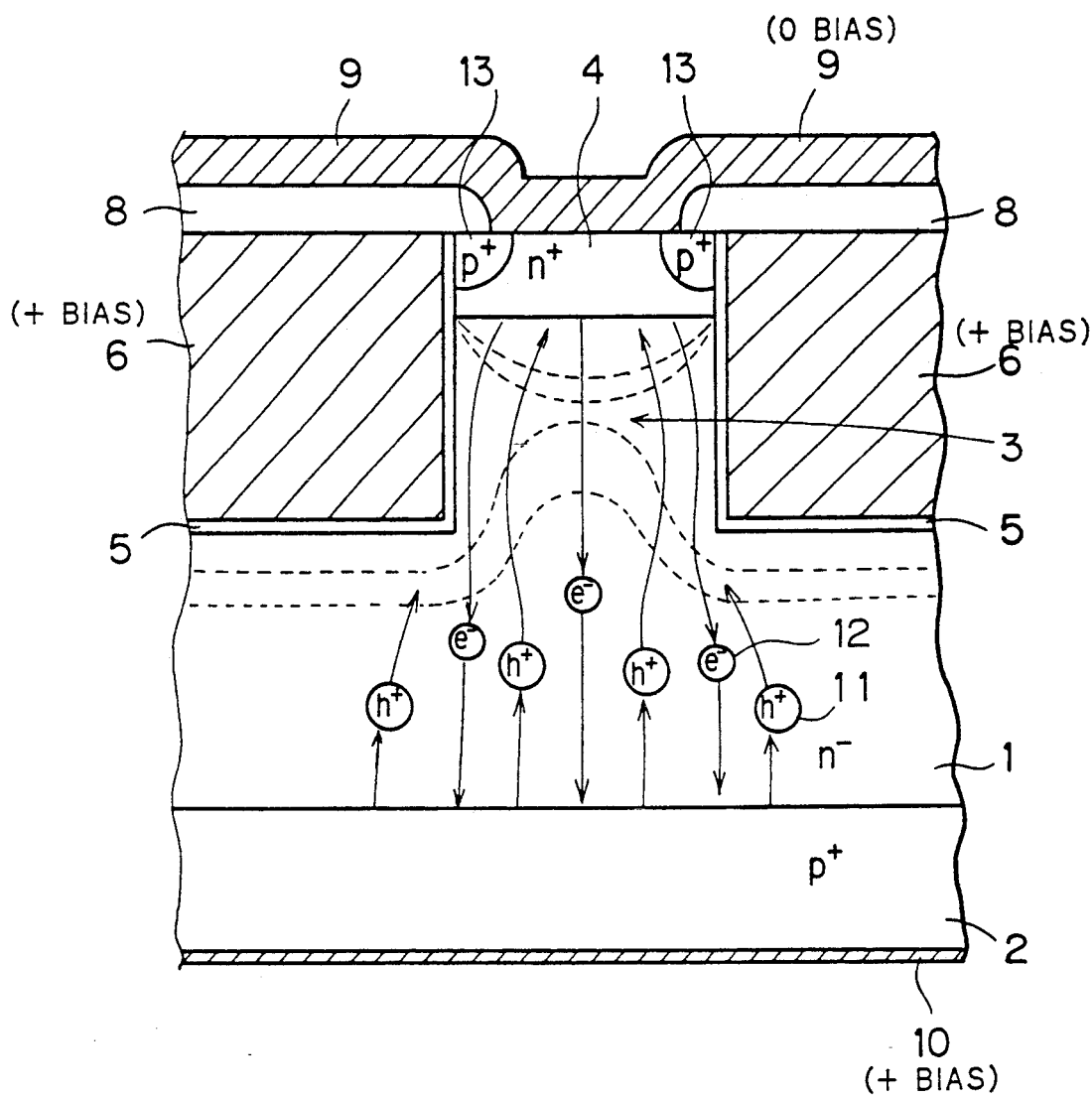
Figure 5:
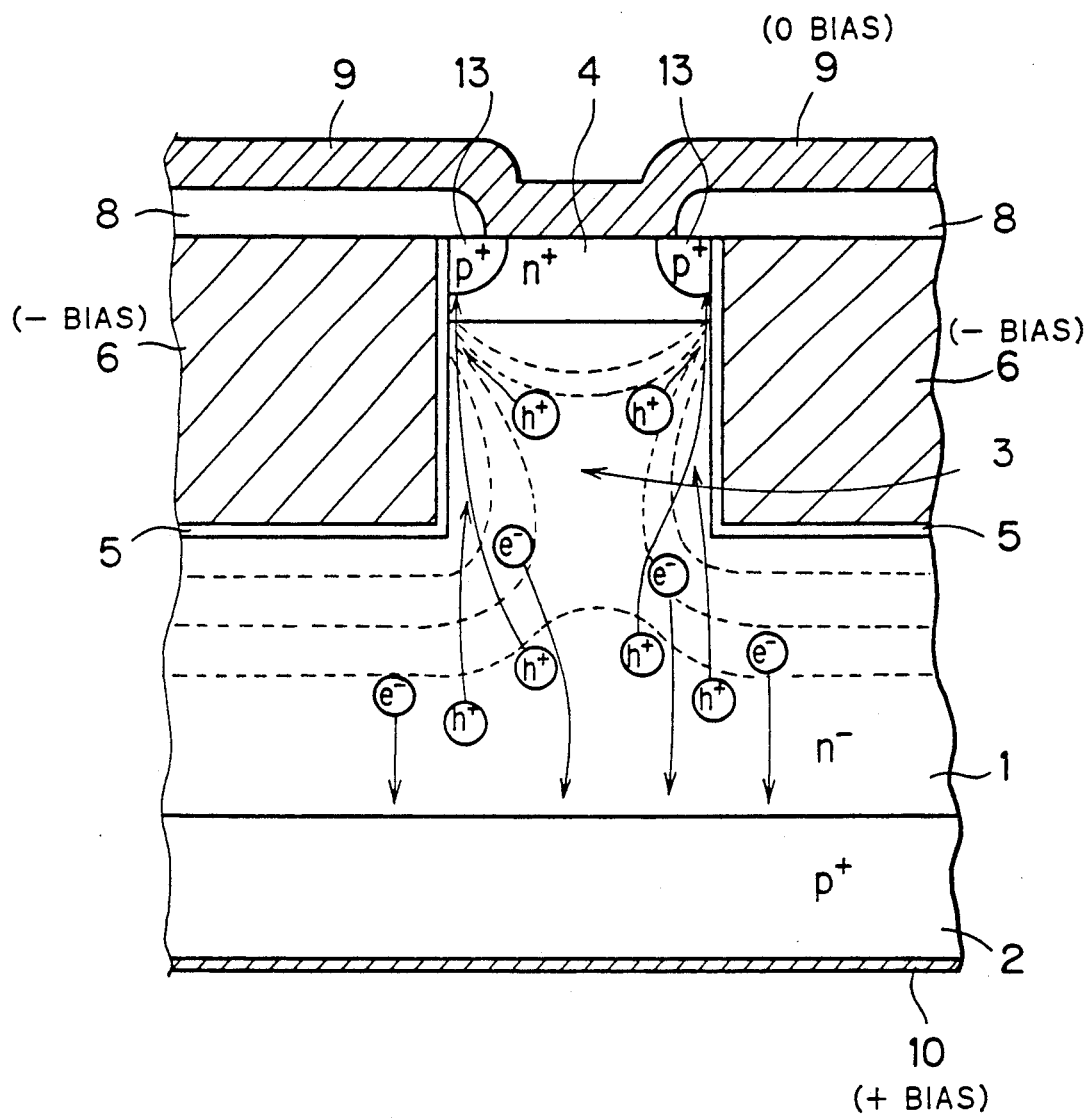
FIG. 5 is a cross-sectional view of the semiconductor device of the first preferred embodiment when it turns off.

The operation of the semiconductor device of FIGS. 1 and 2 will be described below with reference to FIGS. 3 to 5. As the potential at the control electrodes 6 relative to the electrode 9 is decreased with the potential at the electrode 10 relative to the electrode 9 increased, depletion layers extending from the control electrodes 6 come into contact with each other to generate a potential barrier in the protruding portion 3 of the n$^-$ epitaxial layer 1 which lies between the control electrodes 6 as shown in FIG. 3. This prevents electrons from flowing from the electrode 9 toward the electrode 10. Thus current is interrupted.

As the potential at the control electrodes 6 relative to the electrode 9 is increased, the potential barrier disappears and electrons 12 start flowing from the electrode 9 toward the electrode 10. Simultaneously, holes 11 are introduced from the p$^+$ substrate 2 to cause conductivity modulation in the n$^-$ epitaxial layer 1. Since the introduced holes 11 are joined to the electrons again in the n$^-$ epitaxial layer 1 or n$^+$ diffusion region 4 as shown in FIG. 4, the conductivity modulation is sufficiently generated. Thus the semiconductor device turns on. The face of the n$^+$ diffusion region 4 which contacts the n$^-$ epitaxial layer 1 is wholly used at this time, so that increase in ON-voltage is not so large as compared with the prior art.

As the potential at the control electrodes 6 relative to the electrode 9 is decreased again, the potential barrier is generated again in the protruding portion 3 between the control electrodes 6, so that electronic current tends to stop flowing from the electrode 9 toward the electrode 10. Simultaneously, the introduced holes 11 travel along the surface of the insulating films 5 in such a manner that they accumulate on the surface thereof as shown in FIG. 5, to be drawn through p-inverted layers formed in the side face of the n$^+$ diffusion region 4 which is in face-to-face relation to the electrodes 6 and through the p$^+$ diffusion regions 13 into the electrode 9. Thus the semiconductor device turns off. Because of a small resistance when the holes 11 are drawn and a short distance the drawn holes 11 travel, the switching loss is reduced and the switching speed is increased.

The semiconductor device having such construction is enabled to have small switching loss, a high switching speed and a low ON-voltage without influences on the resistance and distance where the holes 11 are drawn, when the p$^+$ diffusion regions 13 are suitably formed even if the n$^+$ diffusion region 4 is increased in area for reduction in ON-voltage. The dotted curves of FIGS. 3 to 5 indicate equipotential lines. The p$^+$ diffusion region 7 which has been used for drawing the holes 11 contributes to the alleviation of electrostatic focusing at the end portion and hardly functions to draw the holes 11.

Figure 6:
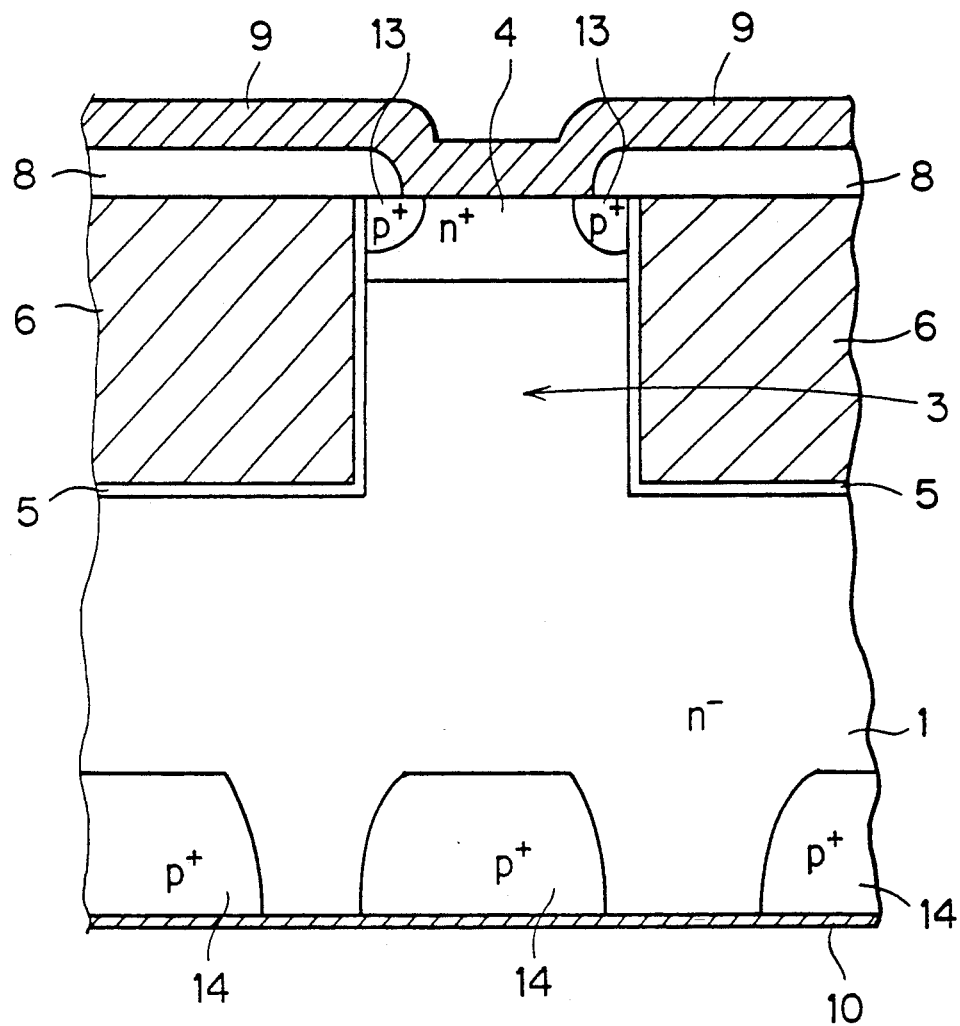
FIG. 6 is a cross-sectional view of a semiconductor device of a second preferred embodiment according to the present invention.
Figure 7:
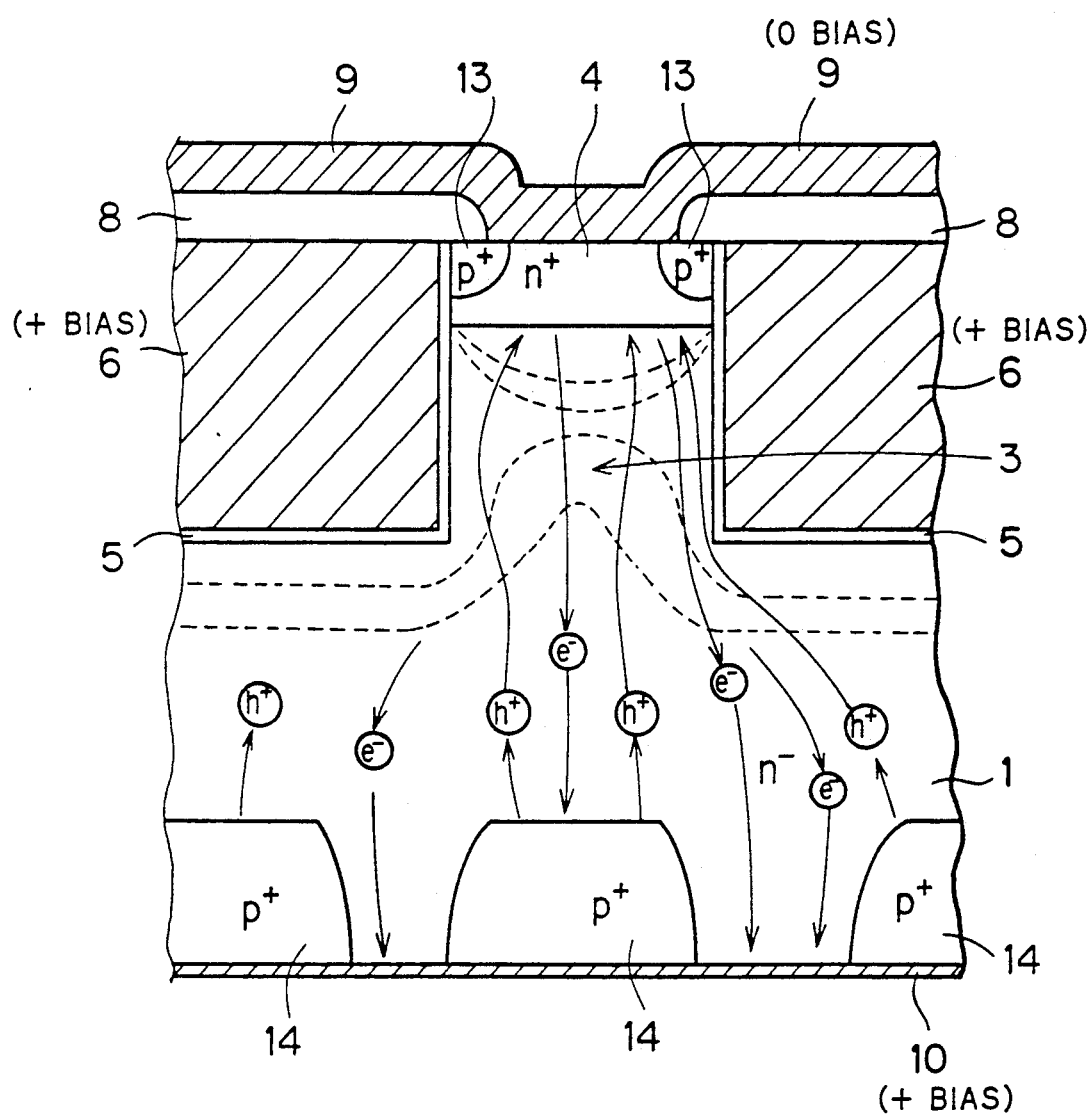
Figure 8:
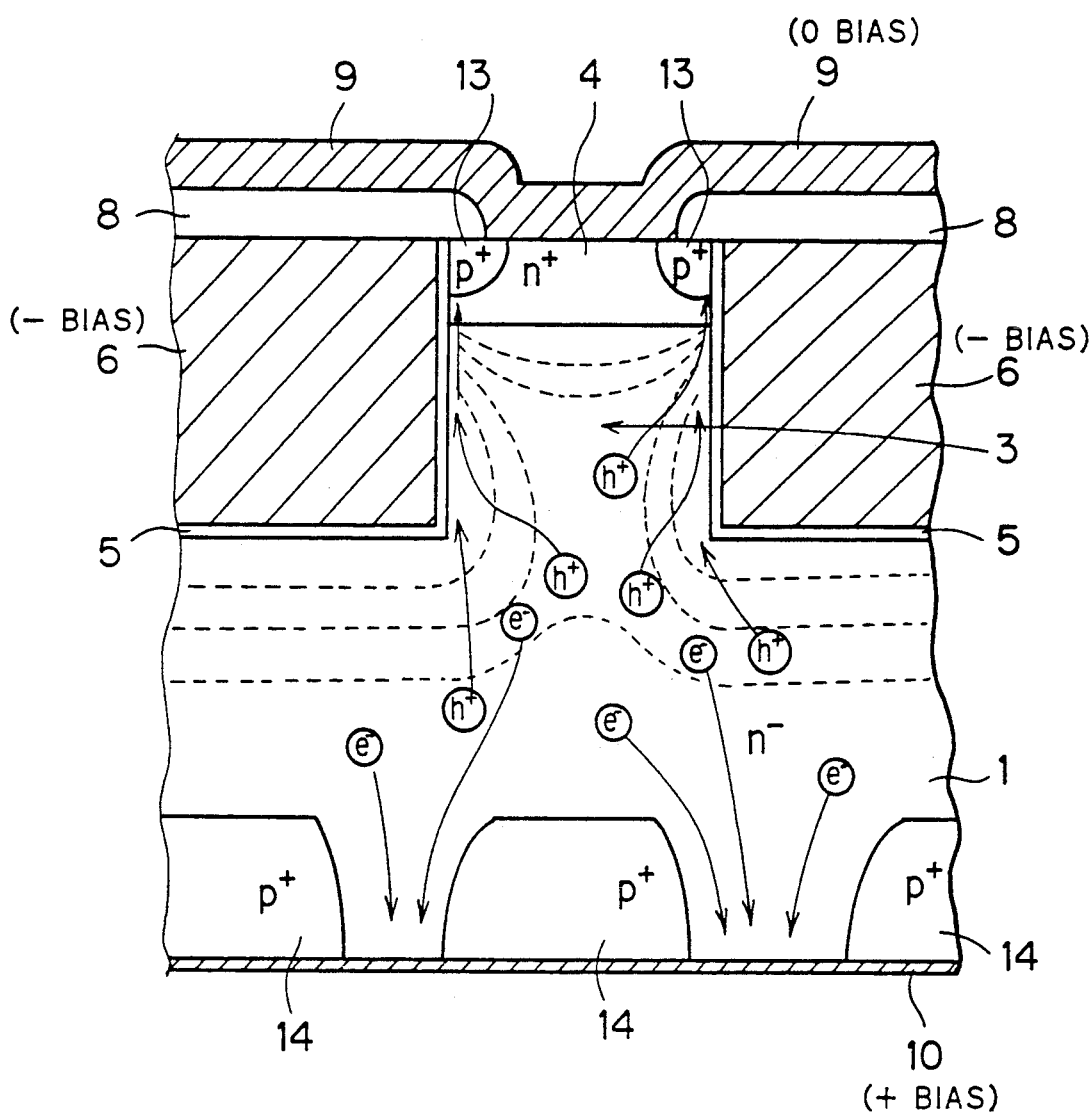
FIG. 8 is a cross-sectional view of the semiconductor device of the second preferred embodiment when it turns off.

Referring to FIGS. 6 to 8, a second preferred embodiment according to the present invention will be described hereinafter. FIG. 6 is a cross-sectional view of a semiconductor device of the second preferred embodiment. Reference numeral 14 designates p$^+$ diffusion regions formed on one major surface of the n$^-$ epitaxial layer 1 and contacting the metal electrode 10. The metal electrode 10 also contacts the n$^-$ epitaxial layer 1. Like reference numerals are used to designate identical or corresponding parts in the first and second preferred embodiments.

The operation of the semiconductor device of the second preferred embodiment is identical with that of the semiconductor device of the first preferred embodiment when current is interrupted. As the potential at the control electrodes 6 relative to the electrode 9 is increased from the current interruption state, the potential barrier disappears and the electrons start flowing toward the electrode 10. A forward bias is applied between the p+ diffusion regions 14 and the n− epitaxial layer 1 by the voltage drop caused by the electronic current. The holes 11 are introduced from the p+ diffusion regions 14 to cause the conductivity modulation in the n− epitaxial layer 1. Since nearly all the introduced holes 11 are joined to the electrons again in the n− epitaxial layer 1 or n+ diffusion region 4 as shown in FIG. 7, the conductivity modulation is sufficiently generated. Thus the semiconductor device turns on.

As the potential at the control electrodes 6 relative to the electrode 9 is decreased again, potential barrier is generated again in the protruding portion 3 between the electrodes 6, so that electronic current tends to stop flowing from the electrode 9 toward the electrode 10. Simultaneously, the introduced holes 11 travel along the surface of the insulating films 5 in such a manner that they accumulate on the surface thereof as shown in FIG. 8, to be drawn through the p-inverted layers formed in the side face of the n+ diffusion region 4 which is in face-to-face relation to the control electrodes 6 and through the p+ diffusion regions 13 into the electrode 9. Thus the semiconductor device turns off.

The high turn-off speed and small turn-off loss of the semiconductor device are achieved in the second preferred embodiment since the introduction of the holes from the p+ diffusion regions 14 is interrupted in the early stage when the semiconductor device turns off and since the electronic current in the n− epitaxial layer 1 mainly flows through the portion in which the electrode 10 contacts the n− epitaxial layer 1.

Figure 9:
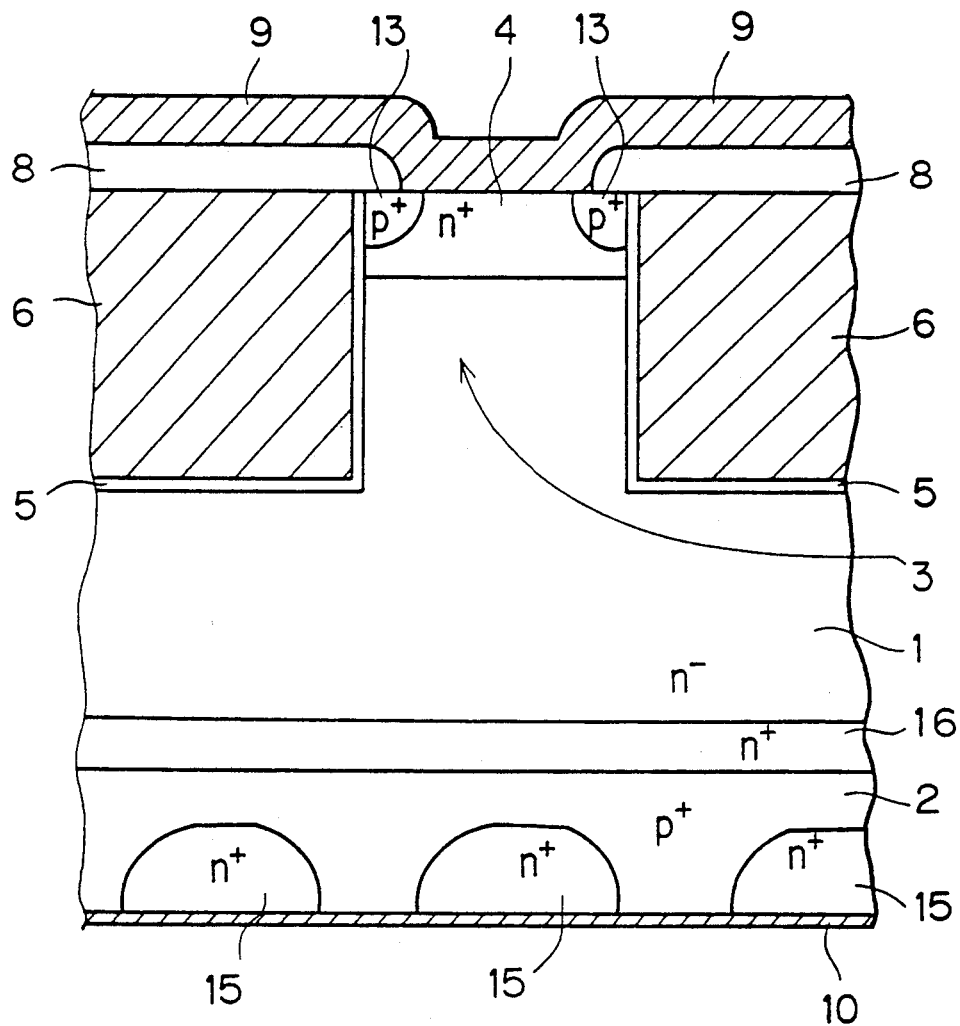
FIG. 9 is a cross-sectional view of a semiconductor device of a third preferred embodiment according to the present invention.

A third preferred embodiment according to the present invention will be described hereinafter with reference to FIG. 9. FIG. 9 is a cross-sectional view of a semiconductor device of the third preferred embodiment. Reference numeral 15 designates n+ regions formed in an surface of the p+ substrate 2; and 16 designates an n+ semiconductor layer formed on the p+ substrate 2. The metal electrode 10 contacts both the p+ substrate 2 and the n+ regions 15. Like reference numerals are used to designate identical or corresponding parts in the first and third preferred embodiments.

As the potential at the control electrodes 6 relative to the electrode 9 is decreased with the potential at the electrode 10 relative to the electrode 9 increased in the semiconductor device of FIG. 9, depletion generates potential barrier against the energy of the electrons in the protruding portion 3 of the n− epitaxial layer 1 which lies between the electrodes 6 to prevent the electrons from flowing from the electrode 9 toward the electrode 10. When the depletion layer reaches the n+ semiconductor layer 16, the n+ semiconductor layer 16 functions to prevent the depletion layer from extending to the p+ substrate 2. Similar effects may be provided when the n+ semiconductor layer 16 is used in the other preferred embodiments. Thus current is interrupted.

As the potential at the control electrodes 6 relative to the electrode 9 is increased, the potential barrier disappears and the electrons start flowing from the electrode 9 toward the electrode 10. Simultaneously, the holes 11 are introduced from the p+ substrate 2 to cause the conductivity modulation in the n− epitaxial layer 1. Since nearly all the introduced holes 11 are joined to the electrons again in the n− epitaxial layer 1 or n+ semiconductor region 4, the conductivity modulation is sufficiently generated. Thus the semiconductor device turns on.

The n+ semiconductor layer 16 functions to suppress the introduction of the holes 11. In general, the construction of the n+ semiconductor layer 16 optimizes the amount of holes 11 to be introduced. On the other hand, the n+ regions 15 function to suppress the introduction of the holes 11 when the current has a high density. Hence, the combination of the n+ regions 15 and n+ semiconductor layer 16 provides the characteristics of ease of current flowing when the current is not higher than a rated current and difficulty of current flowing and semiconductor device breakdown when the current is not lower than the rated current.

As the potential at the control electrodes 6 relative to the electrode 9 is decreased again, the potential barrier is generated in the protruding portion 3 of the n− epitaxial layer 1 which lies between the control electrodes 6, so that electronic current tends to stop flowing from the electrode 9 toward the electrode 10. Simultaneously, the introduced holes 11 travel along the surface of the insulating films 5 in such a manner that they accumulate on the surface thereof, to be drawn through the p-inverted layers formed in the side face of the n+ diffusion region 4 which is in face-to-face relation to the control electrodes 6 and through the p+ diffusion regions 13 into the electrode 9. Thus the semiconductor device turns off.

Figure 10:
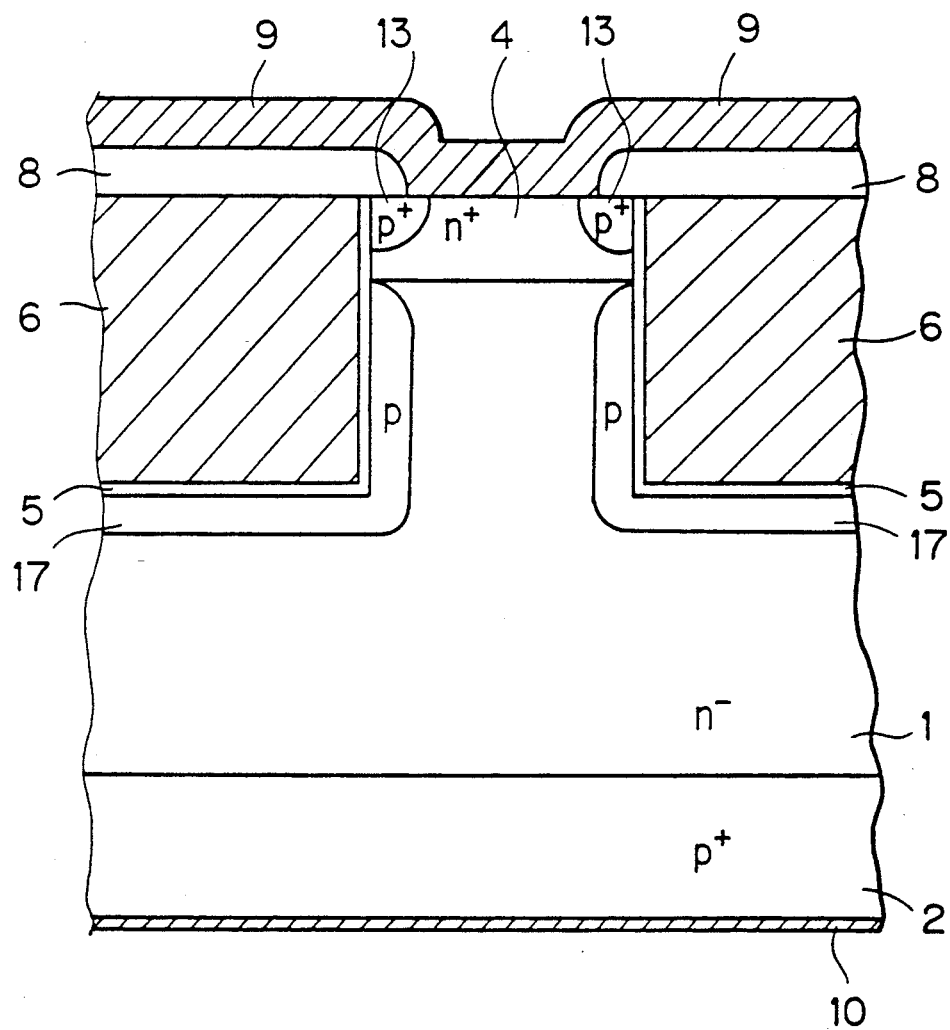
FIG. 10 is a cross-sectional view of a semiconductor device of a fourth preferred embodiment according to the present invention.

A fourth preferred embodiment according to the present invention will be described hereinafter with reference to FIG. 10. FIG. 10 is a cross-sectional view of a semiconductor device of the fourth preferred embodiment. Reference numeral 17 designates p diffusion regions formed between the insulating films 5 and n− epitaxial layer 1. Like reference numerals are used to designate identical or corresponding parts in the first and fourth preferred embodiments.

Figure 11A:
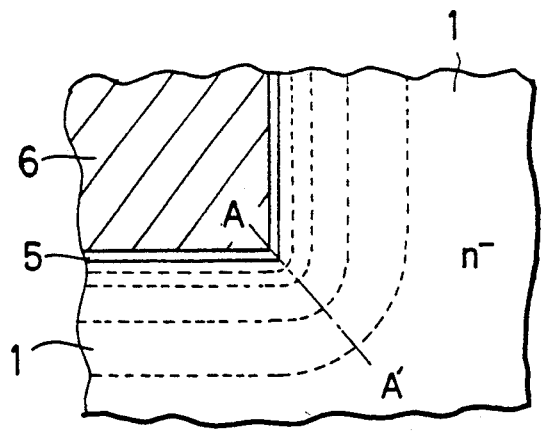
FIGS. 11A to 11D show electric fields in the semiconductor devices of FIGS. 1 and 10.
Figure 11B:
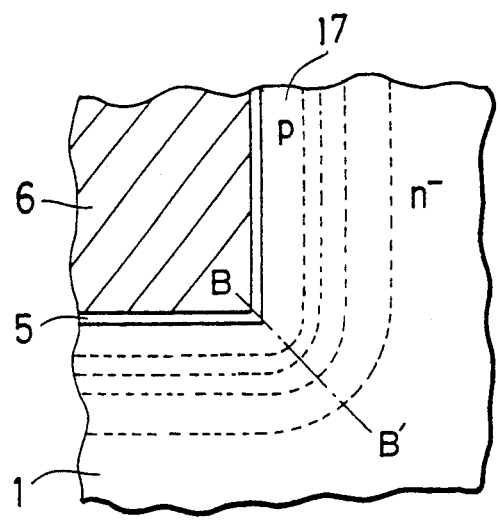
Figure 11C:
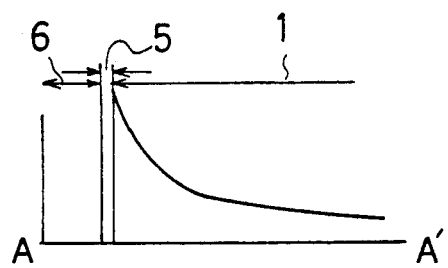
Figure 11D:
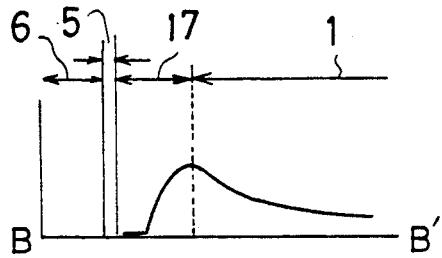

As the potential at the control electrodes 6 relative to the electrode 9 is decreased with the potential at the electrode 10 relative to the electrode 9 increased in the semiconductor device of FIG. 10, the depletion generates a potential barrier against the energy of the electrons in the protruding portion 3 of the n− epitaxial layer 1 which lies between the electrodes 6 to prevent the electrons from flowing from the electrode 9 toward the electrode 10. Thus current is interrupted. Since the p diffusion regions 17 alleviate the electric field between the insulating films 5 and the n− epitaxial layer 1 at this time, a breakdown voltage is easily increased when the semiconductor device turns off, as shown in FIGS. 11A to 11D. FIG. 11A shows equipotential lines around the control electrodes 6 when the p diffusion layers 17 are absent; FIG. 11B shows equipotential lines therearound when the p diffusion layers 17 are present; FIG. 11C shows the distribution of the electric field taken along the line A—A' of FIG. 11A when the p diffusion layers 17 are absent; and FIG. 11D shows the distribution of the electric field taken along the line B—B' of FIG. 11B when the p diffusion layers 17 are present. FIGS. 11A to 11D are schematically shown for ease of understanding. It is apparent from FIGS. 11A to 11D that the breakdown voltage is ensured when the control electrodes 6 are shallow.

As the potential at the control electrodes 6 relative to the electrode 9 is increased, the potential barrier disappears and the electrons start flowing from the electrode 9 toward the electrode 10. Simultaneously, the holes 11 are introduced from the p+ substrate 2 in the same manner as in FIG. 4 to cause the conductivity modulation in the n− epitaxial layer 1. Since nearly all the introduced holes 11 are joined to the electrons again in the n− epitaxial layer 1 or n+ semiconductor region 4, the conductivity modulation is sufficiently generated. Thus the semiconductor device turns on.

As the potential at the control electrodes 6 relative to the electrode 9 is decreased again, the potential barrier is generated again in the protruding portion 3 of the n− epitaxial layer 1 which lies between the control electrodes 6, so that the electronic current tends to stop flowing from the electrode 9 toward the electrode 10. Simultaneously, the introduced holes 11 flow into the p diffusion regions 17 formed on the surface of the insulating films 5 in the same manner as in FIG. 5 to be drawn through the p-inverted layers formed in the side face of the n+ diffusion region 4 which is in face-to-face relation to the control electrodes 6 and through the p+ diffusion regions 13 into the electrode 9. Thus the semiconductor device turns off. The p diffusion regions 17 decrease the resistance when the holes 11 are drawn to provide the high turn-off speed and small turn-off loss.

Figure 12:
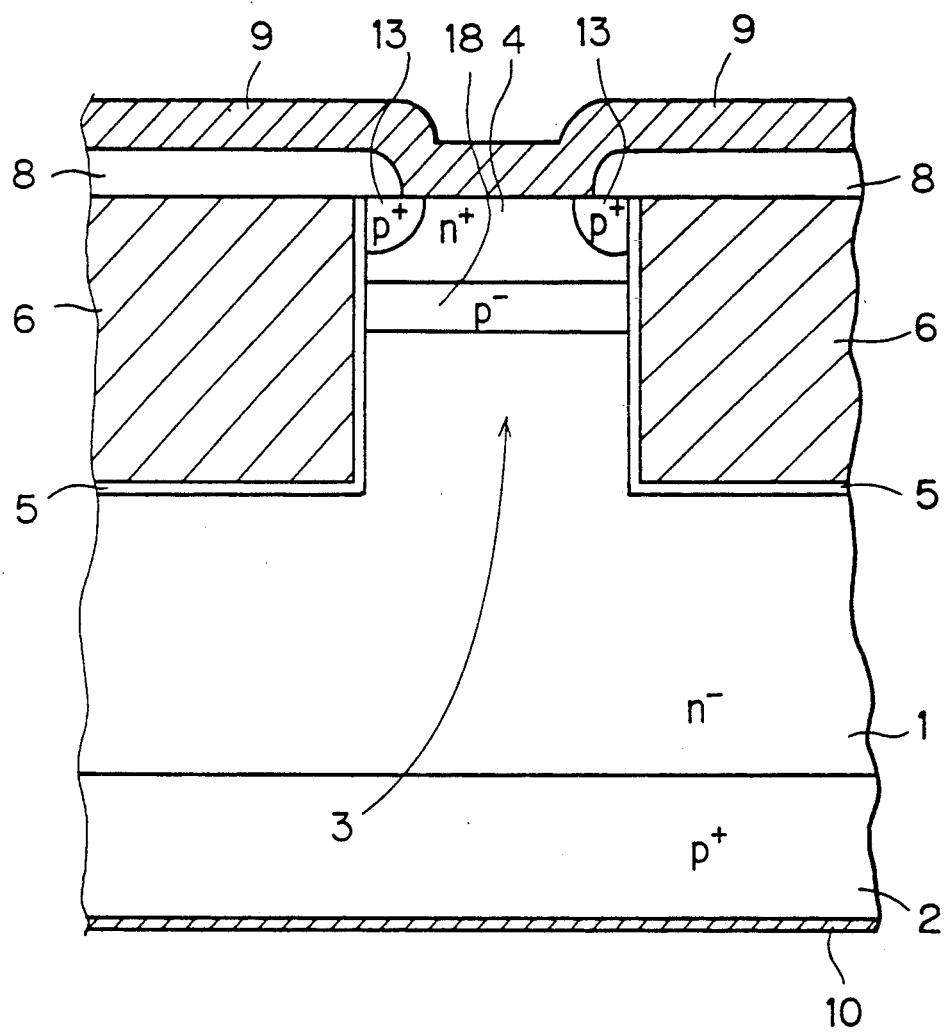
FIG. 12 is a cross-sectional view of a semiconductor device of a fifth preferred embodiment according to the present invention.

A fifth preferred embodiment according to the present invention will be described hereinafter with reference to FIG. 12. FIG. 12 is a cross-sectional view of a semiconductor device of the fifth preferred embodiment. Reference numeral 18 designates a p− region formed between the n+ diffusion region 4 and the upper surface of the protruding portion 3 of the n− epitaxial layer 1. Like reference numerals are used to designate identical or corresponding parts in the first and fifth preferred embodiments.

Figure 13:
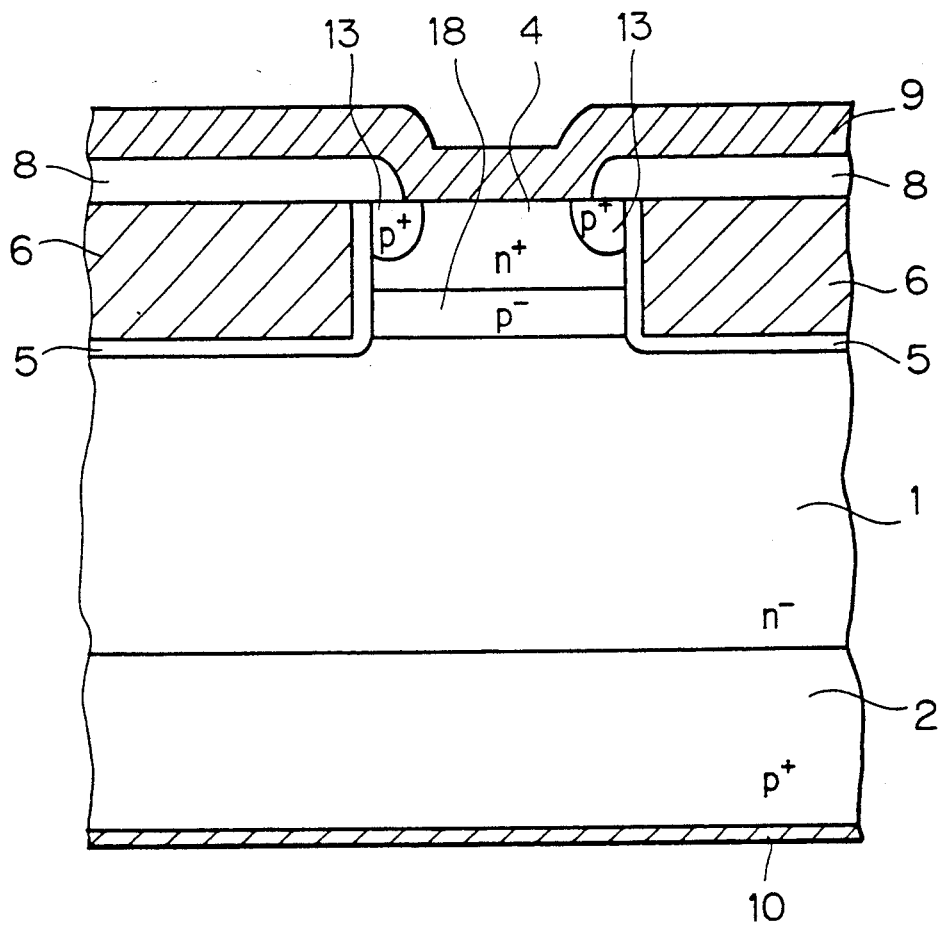
FIG. 13 is a cross-sectional view of another semiconductor device of the fifth preferred embodiment according to the present invention.

As the potential at the control electrodes 6 relative to the electrode 9 is decreased with the potential at the electrode 10 relative to the electrode 9 increased in the semiconductor device of FIG. 12, depletion generates potential barrier against the energy of the electrons in the protruding portion 3 of the n− epitaxial layer 1 which lies between the electrodes 6 to prevent the electrons from flowing from the electrode 9 toward the electrode 10. Thus current is interrupted. Since the p− region 18 functions to prevent the depletion layer from reaching the n+ diffusion region 4, it is unnecessary to largely decrease the voltage of the control electrodes 6. The semiconductor device is enabled to turn off normally. That is, when the p− region 18 has a higher impurity concentration, the breakdown voltage is directly held between the p− region 18 and n− epitaxial layer 1, or the current is interrupted without generation of the potential barrier. FIG. 13 shows a semiconductor device which does not include the protruding portion 3 on the surface of the n− epitaxial layer 1. Such construction affords a thin semiconductor device.

As the potential at the control electrodes 6 relative to the electrode 9 is increased, the potential barrier disappears and the electrons start flowing from the electrode 9 toward the electrode 10. At this time, the electrons are introduced from the whole junction of the n+ diffusion region 4 and p− region 18 when the p− region 18 is completely depleted. A portion of the p− region 18 which faces the control electrodes 6 is inverted into n type to permit the electronic current to flow through the n-inverted layer when the p− region 18 is not completely depleted. Simultaneously, the holes 11 are introduced from the p+ substrate 2 to cause the conductivity modulation in the n− epitaxial layer 1. Since nearly all the introduced holes 11 are joined to the electrons again in the n− epitaxial layer 1, p− region 18 or n+ semiconductor region 4, the conductivity modulation is sufficiently generated. Such structure including an npnp thyristor structure may exhibit latch characteristics. Thus the semiconductor device turns on.

As the potential at the control electrodes 6 relative to the electrode 9 is decreased again, potential barrier is generated again in the protruding portion 3 of the n− epitaxial layer 1 which lies between the control electrodes 6, so that the electronic current tends to stop flowing from the electrode 9 toward the electrode 10. Simultaneously, the introduced holes 11 travel along the surface of the insulating films 5 in such a manner that they accumulate on the surface thereof, to be drawn through the p-inverted layers formed in the side face of the n+ diffusion region 4 which is in face-to-face relation to the control electrodes 6 and through the p+ diffusion regions 13 into the electrode 9. Thus the semiconductor device turns off.

Figure 14:
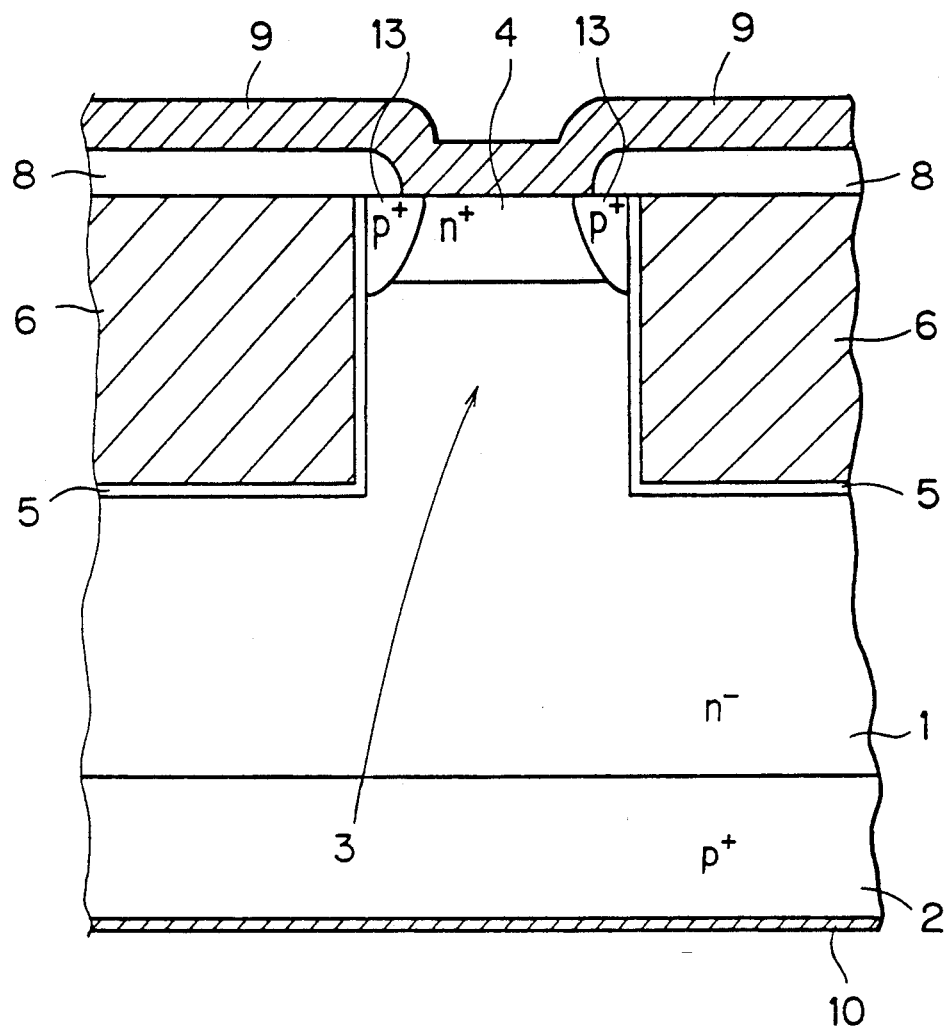
FIG. 14 is a plan view of another semiconductor device of the first preferred embodiment according to the present invention.

In the first to fifth preferred embodiments, the p+ diffusion regions 13 are out of contact with the n− epitaxial layer 1. The p+ diffusion regions 13, however, may contact the n− epitaxial layer 1 as shown in FIG. 14, for example, in the structure of the first preferred embodiment, to provide the same effects. In this case, the holes 11 are drawn through not only the p-inverted layers formed in the n+ diffusion region 4 but also the p+ diffusion regions 13 directly when the semiconductor device turns off. It is necessary that the p+ diffusion regions 13 are not in direct contact with the p diffusion regions 17 and p− region 18 in the fourth and fifth preferred embodiments.

Figure 15:
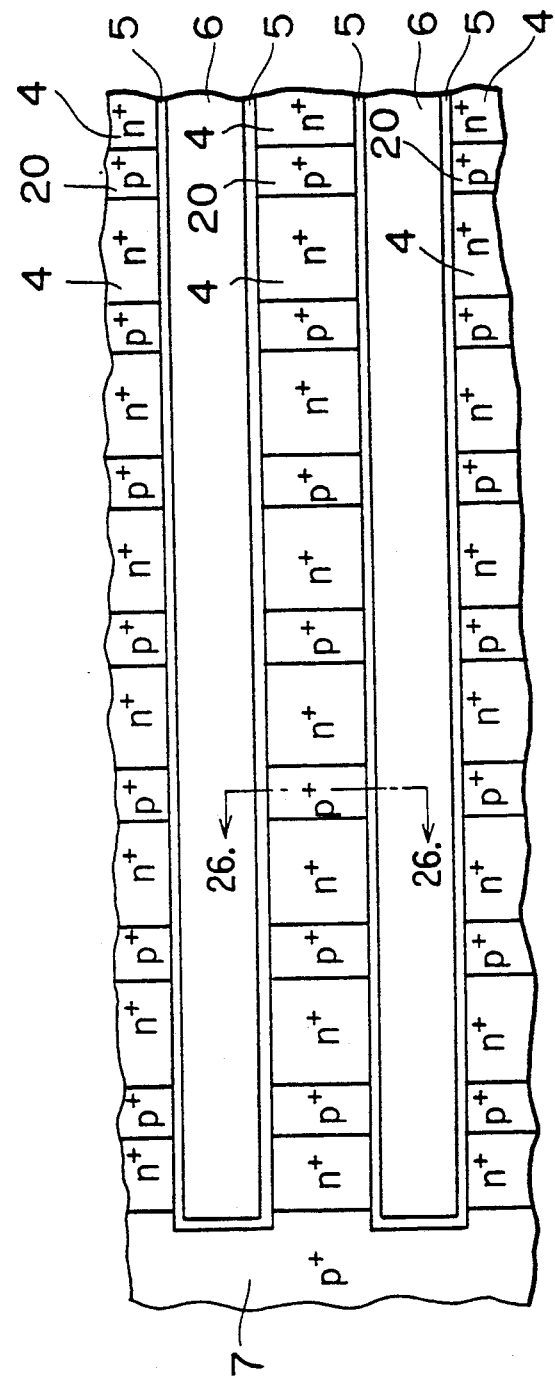
FIG. 15 is a plan view of a semiconductor device of a sixth preferred embodiment according to the present invention.
Figure 16:
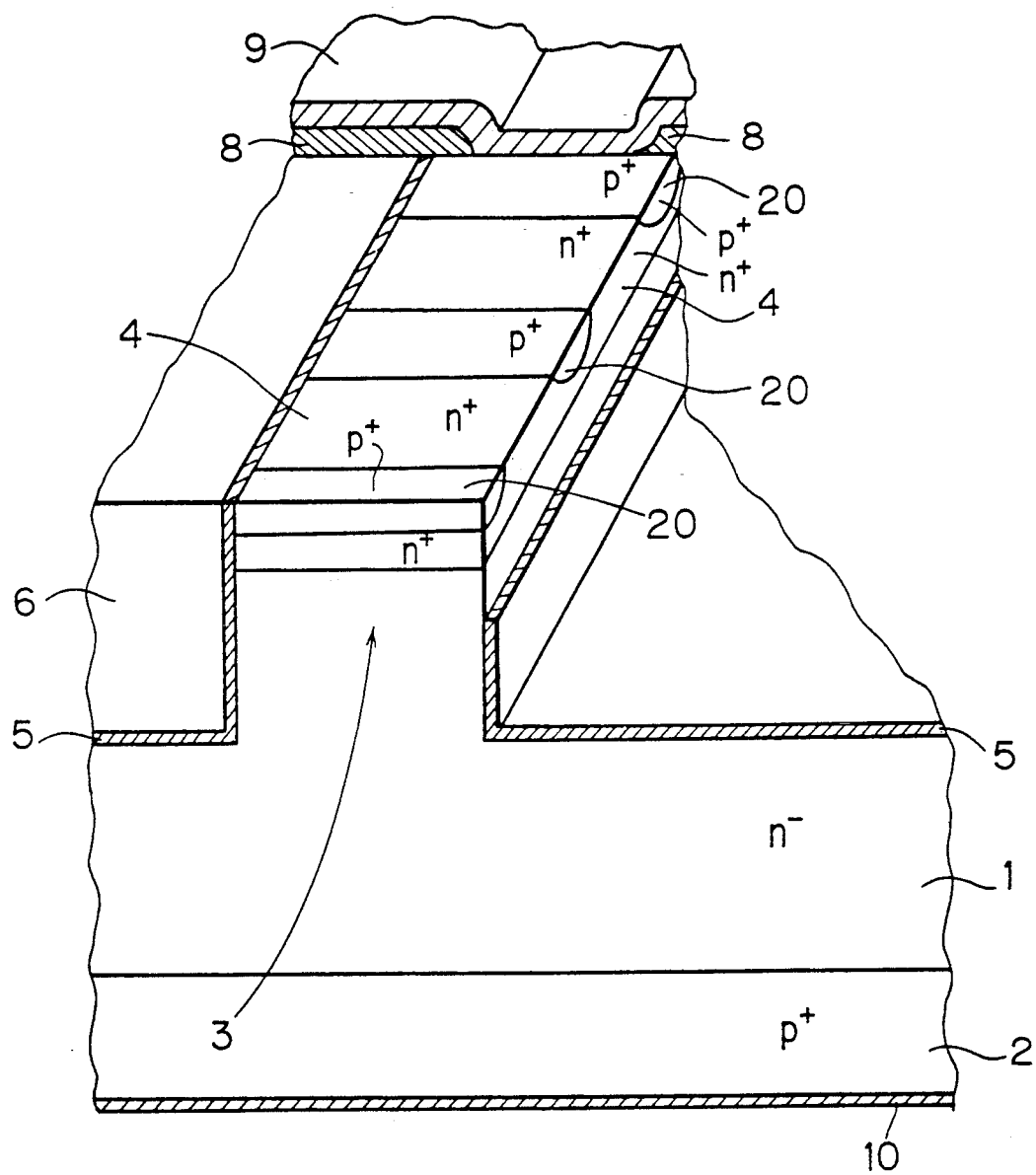
FIG. 16 is a perspective cross-sectional view taken along the line Z—Z of FIG. 15.

A sixth preferred embodiment according to the present invention will be described hereinafter with reference to FIGS. 15 and 16. FIGS. 15 and 16 are plan and cross-sectional views of a semiconductor device of the sixth preferred embodiment, respectively. Reference numeral 1 designates an n− epitaxial layer; 2 designates a p+ substrate; 3 designates a protruding portion formed on the surface of the n− epitaxial layer 1; 4 designates an n+ diffusion region formed on the upper surface of the protruding portion 3; 5 designates insulating films formed on the upper surface of the n− epitaxial layer 1 and on both side faces of the protruding portion 3 and n+ diffusion region 4; 6 designates a pair of gate electrodes formed on opposite sides of the protruding portion 3; 8 designates an insulating film; 7 designates a p+ diffusion region provided at the end of the n+ diffusion region 4; and 20 designates a plurality of p+ diffusion regions formed in the surface of the n+ diffusion region 4 in contact with the insulating films 5 on both sides thereof. The p+ diffusion regions 20 are independently spaced apart from each other in the n+ diffusion region 4 as shown in FIGS. 15 and 16. Reference numeral 9 designates an Al-Si electrode formed in contact with the n+ diffusion region 4 and p+ diffusion regions 20; and 10 designates a metal electrode contacting the p+ substrate 2. For ease of understanding of the structure, the electrode 9 and insulating film 8 are not illustrated in the plan view of FIG. 15, and parts of the control electrodes 6 and insulating films 5 shown in FIG. 15 are not illustrated but the electrode 9 and insulating film 8 are partially illustrated in the cross-section of FIG. 16 taken along the line Z—Z of FIG. 15.

The semiconductor device of the sixth preferred embodiment is different from that of the first preferred embodiment in the p+ diffusion regions formed in the n− diffusion region 4. Specifically, the semiconductor device of the first preferred embodiment includes the p+ diffusion regions 13 formed along the insulating films 5 formed on opposite sides of the protruding portion 3 in the cross-section of FIG. 2, and the semiconductor device of the sixth preferred embodiment includes the p+ diffusion regions 20 each formed in contact with the insulating films 5 formed on opposite sides of the protruding portion 3 in the cross-section of FIG. 16. The operation and effects of the semiconductor device of the sixth preferred embodiment are substantially the same as those of the semiconductor device of the first preferred embodiment. Although the width of the protruding portion 3 is limited by allowance for the contact of the electrode 9 with the p+ diffusion regions 13 in the first preferred embodiment, it is unnecessary to consider the allowance for the contact so that the protruding portion 3 is permitted to be narrow in the sixth preferred embodiment. This facilitates the formation of the potential barrier when the semiconductor device turns off, so that the turn-off speed is further improved and the turn-off loss is further reduced.

Figure 17:
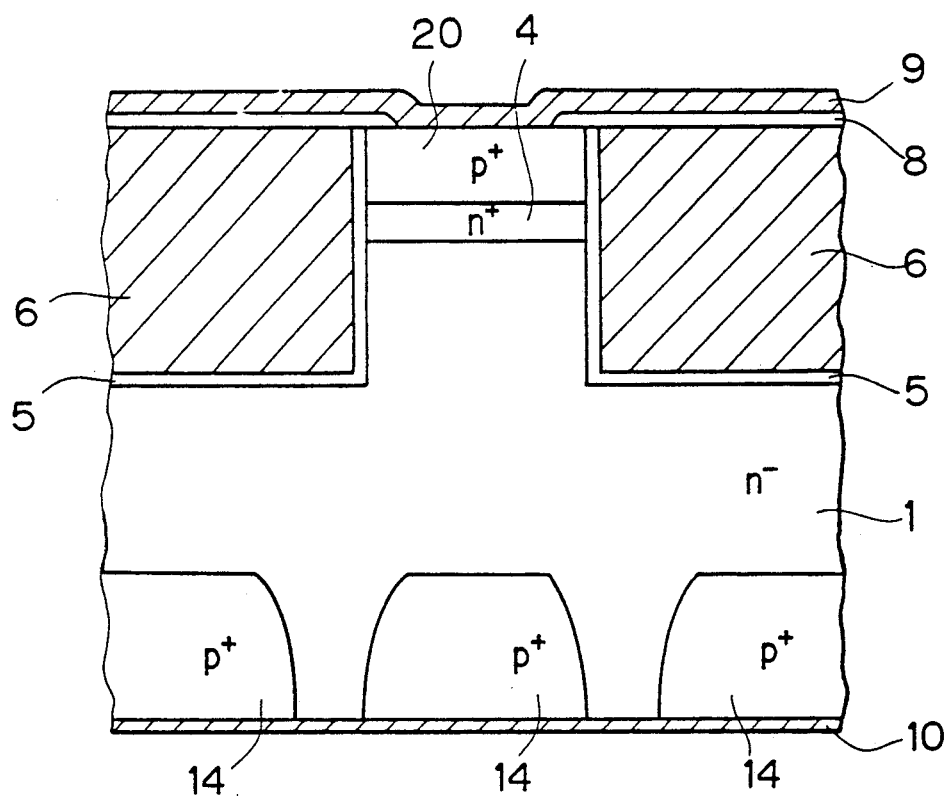
FIG. 17 is a cross-sectional view of a semiconductor device of a combination of the sixth and second preferred embodiments according to the present invention.
Figure 18:
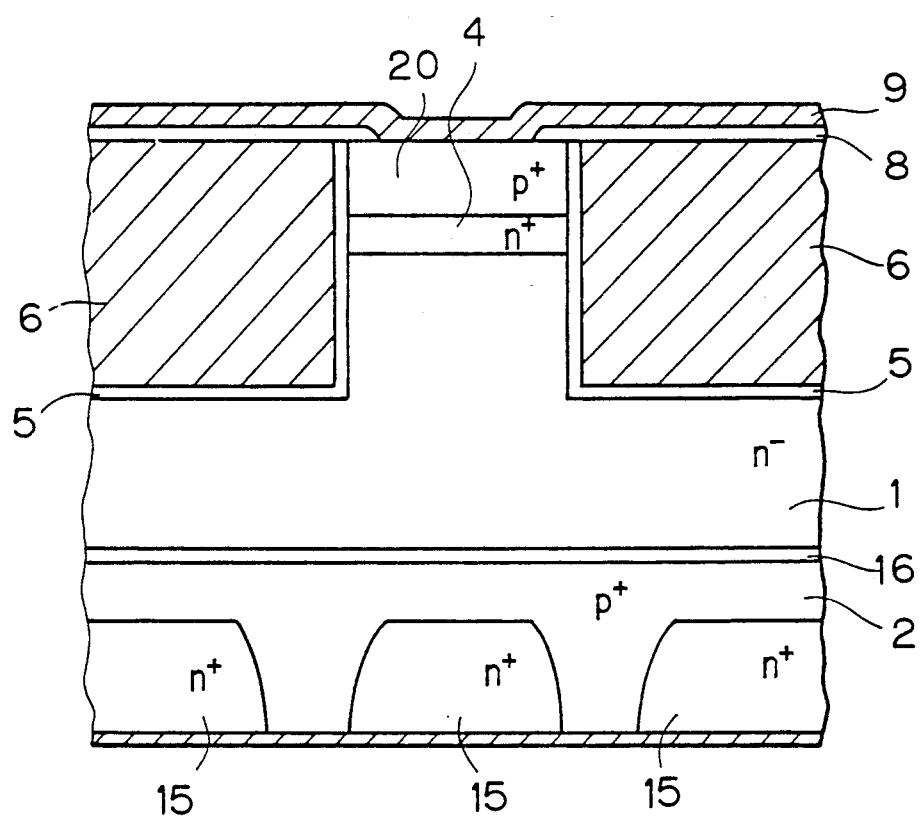
FIG. 18 is a cross-sectional view of a semiconductor device of a combination of the sixth and third preferred embodiments according to the present invention.
Figure 19:
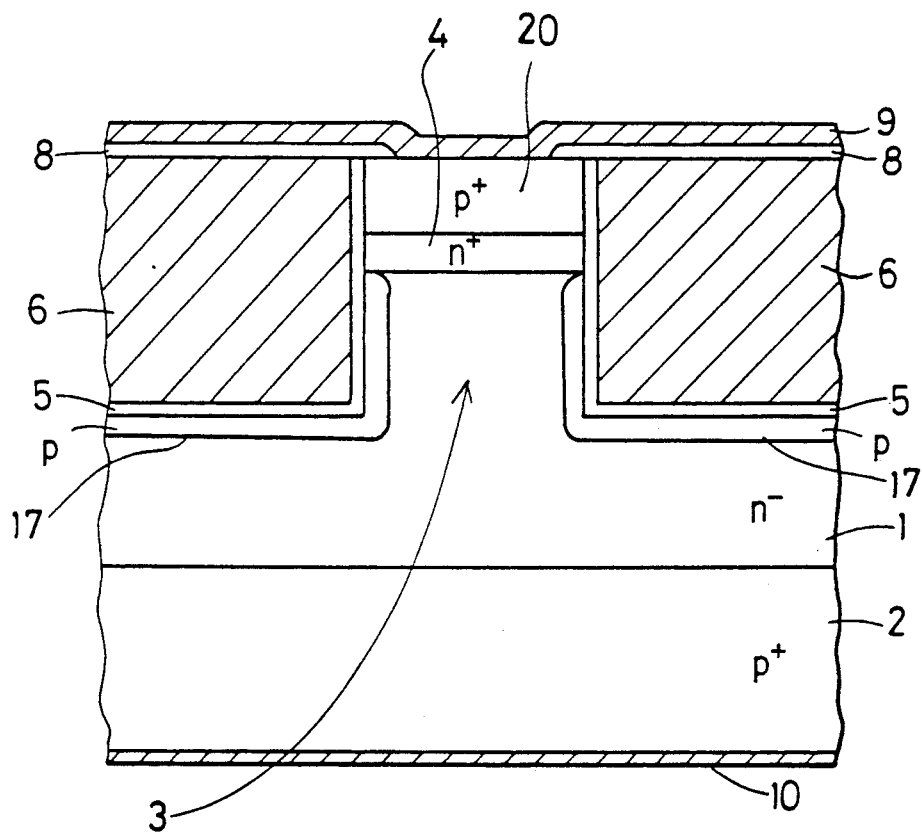
FIG. 19 is a cross-sectional view of a semiconductor device of a combination of the sixth and fourth preferred embodiments according to the present invention.
Figure 20:
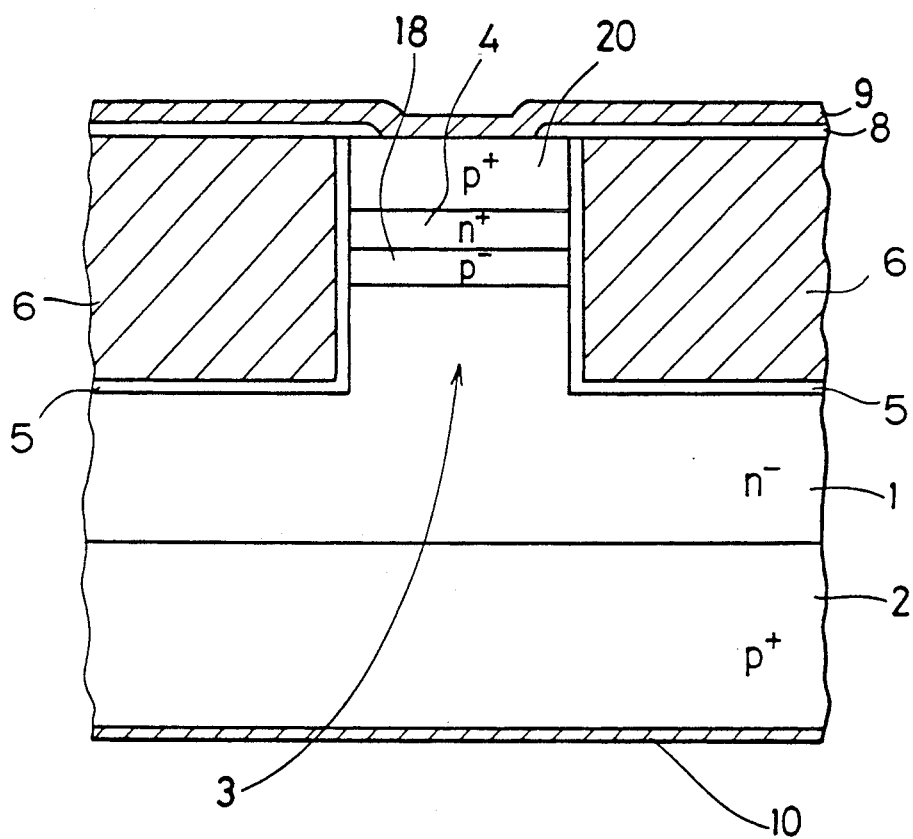
FIG. 20 is a cross-sectional view of a semiconductor device of a combination of the sixth and fifth preferred embodiments according to the present invention.
Figure 21:
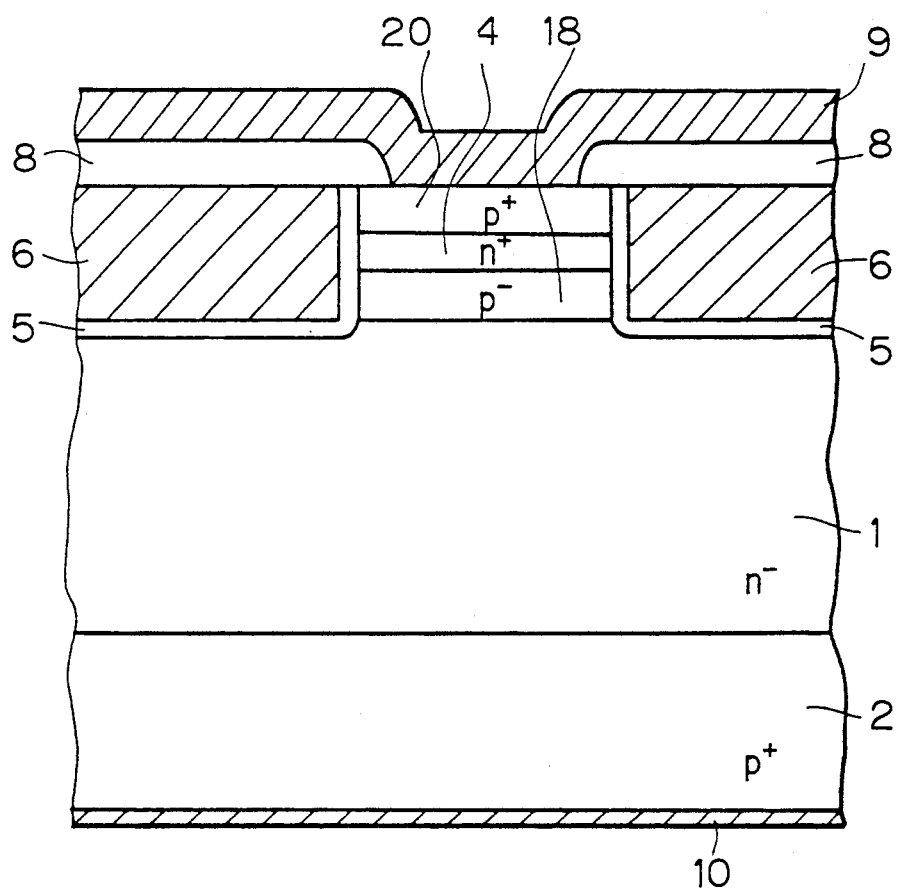
FIG. 21 is a cross-sectional view of another semiconductor device of the combination of the sixth and fifth preferred embodiments according to the present invention.

The sixth preferred embodiment may be combined with the second to fifth preferred embodiments, respectively. The operation and effects of the combinations are the same as those of the respective preferred embodiments. FIG. 17 is a cross-sectional view of a combination of the second and sixth preferred embodiments; FIG. 18 is a cross-sectional view of a combination of the third and sixth preferred embodiments; FIG. 19 is a cross-sectional view of a combination of the fourth and sixth preferred embodiments; and FIGS. 20 and 21 are cross-sectional views of combinations of the fifth and sixth preferred embodiments.

Figure 22:
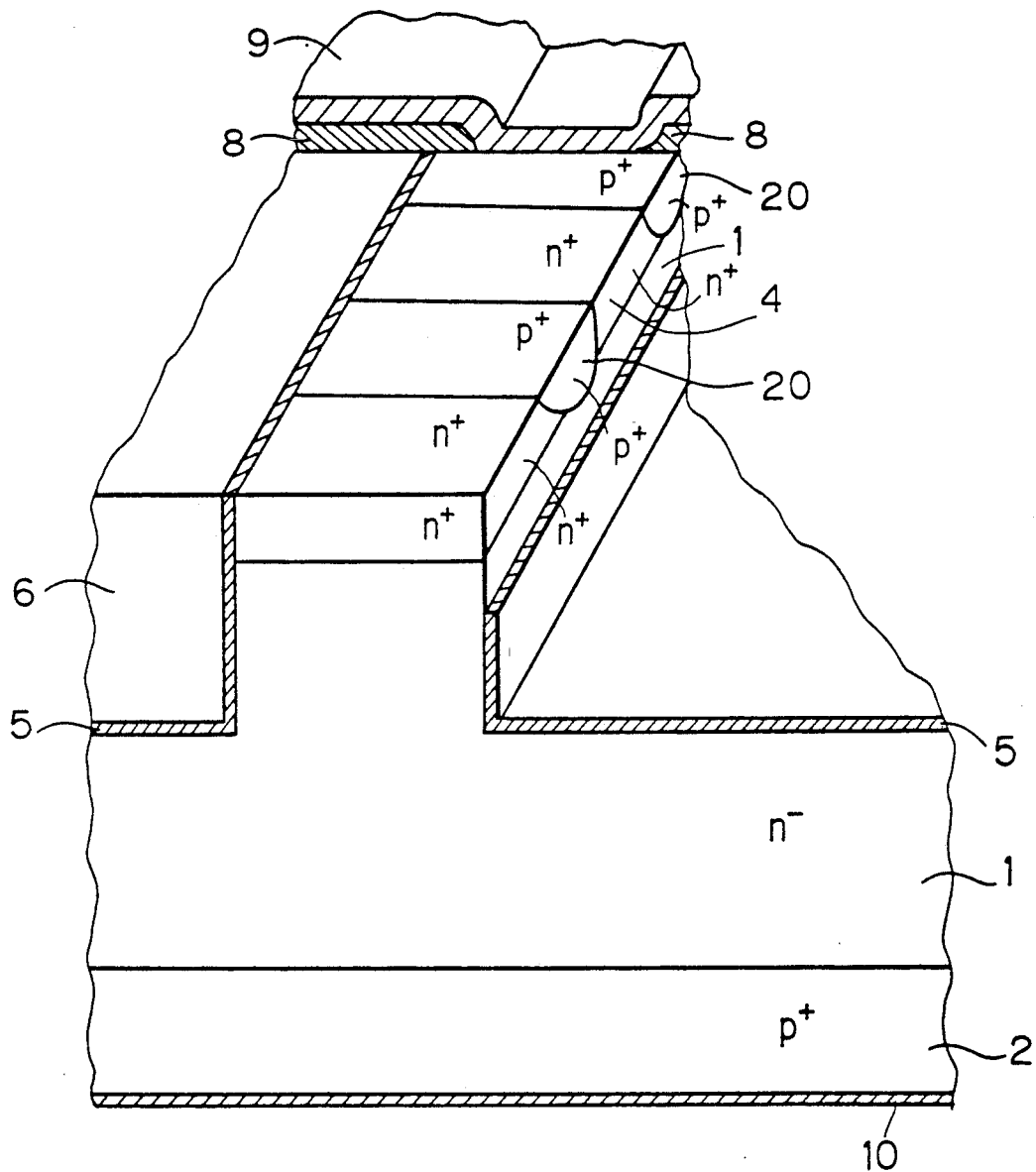
FIG. 22 is a plan view of another semiconductor device of the sixth preferred embodiment according to the present invention.

The p+ diffusion regions 20 are shown out of contact with the n− epitaxial layer 1 in the sixth preferred embodiment. The p+ diffusion regions 20 may be in contact with the n− epitaxial layer 1 as shown in FIG. 22 in the structure like the first preferred embodiment, whereby the same effects are provided. In this case, the holes 11 may be drawn through not only the p-inverted layers formed in the n+ type diffusion region 4 but also the p+ diffusion regions 20 directly when the semiconductor device turns off. The same is true for the combinations of the sixth preferred embodiment with the second to fifth preferred embodiments, respectively. It is, however, necessary that the p+ diffusion regions 20 are not in direct contact with the p diffusion regions 17 and p− region 18 in the fourth and fifth preferred embodiments.

Referring to FIGS. 23 to 29, description will be given on a method of fabricating the semiconductor device of FIGS. 1 and 2. An n− epitaxial layer 32 is formed on a p+ substrate 31 by the epitaxial growth technique.

Figure 23:
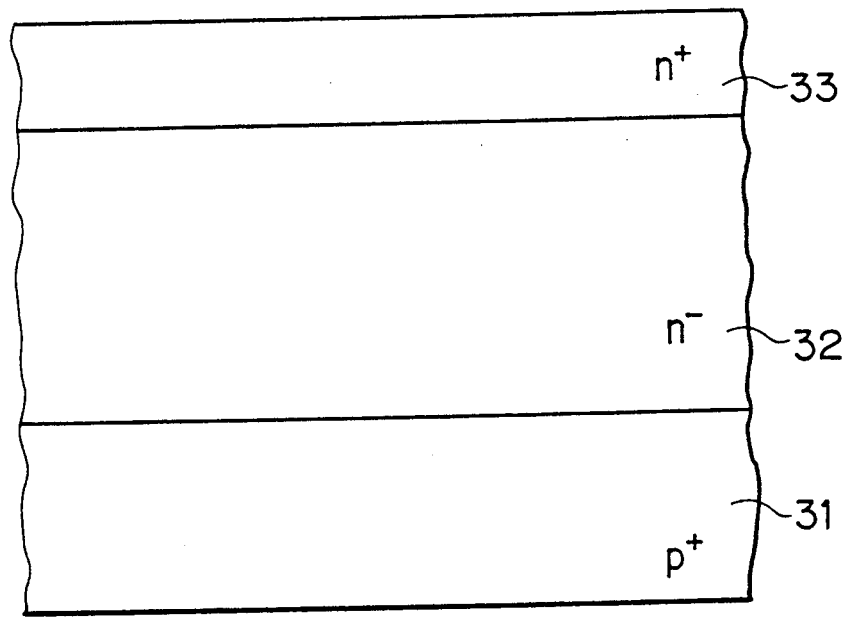
FIGS. 23 to 29 are cross-sectional views showing the process steps for fabricating the semiconductor device of the present invention.

A resist is formed on the n− epitaxial layer 32 and n-type impurities are introduced into the n− epitaxial layer 32 using the resist as a mask. After the removal of the resist, annealing is preformed to form an n+ diffusion region 33 as shown in FIG. 23.

Figure 24:
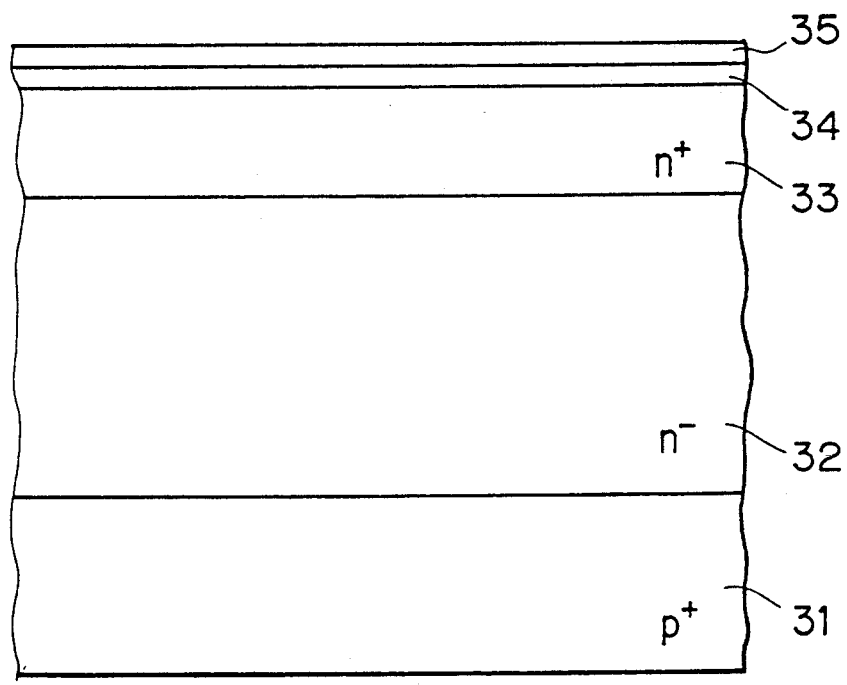

As shown in FIG. 24, a base oxide film 34 is formed over the n+ diffusion region 33, and a resist 35 is formed thereon. The resist 35 is patterned to open windows for doping.

Figure 25:
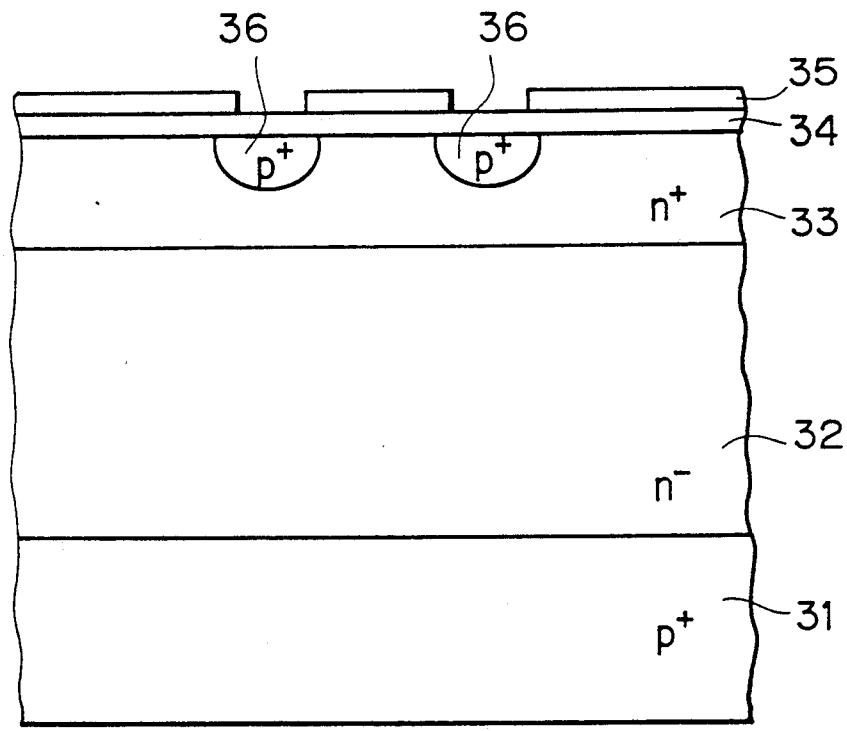

As shown in FIG. 25, p-type impurities are implanted from the windows of the resist 35, and p+ diffusion regions 36 are formed by annealing.

Figure 26:
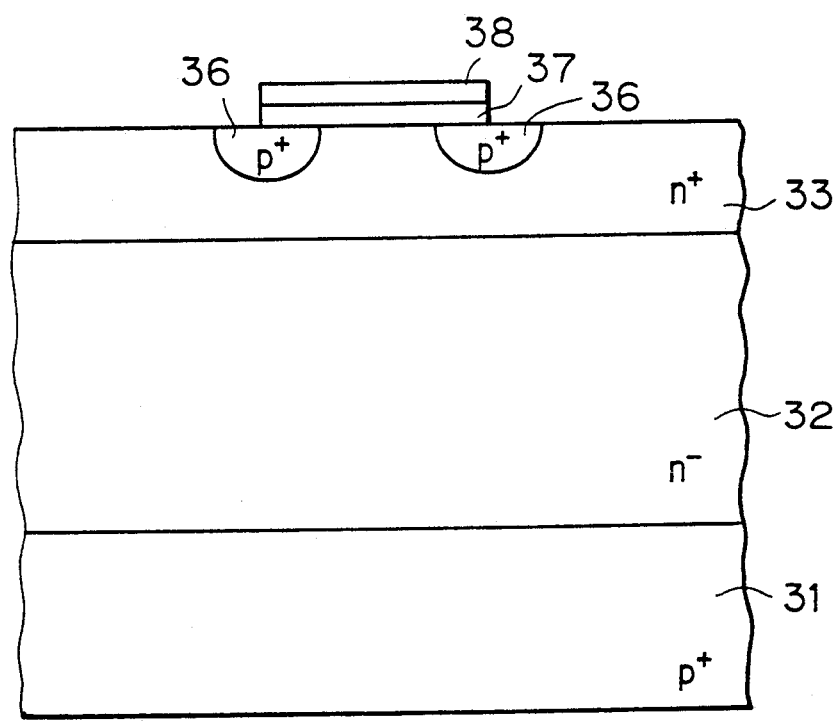

The base oxide film 34 and resist 35 are removed, and a base oxide film 37 and a nitride film 38 are formed as shown in FIG. 26. The base oxide film 37 and nitride film 38 are then patterned.

Figure 27:
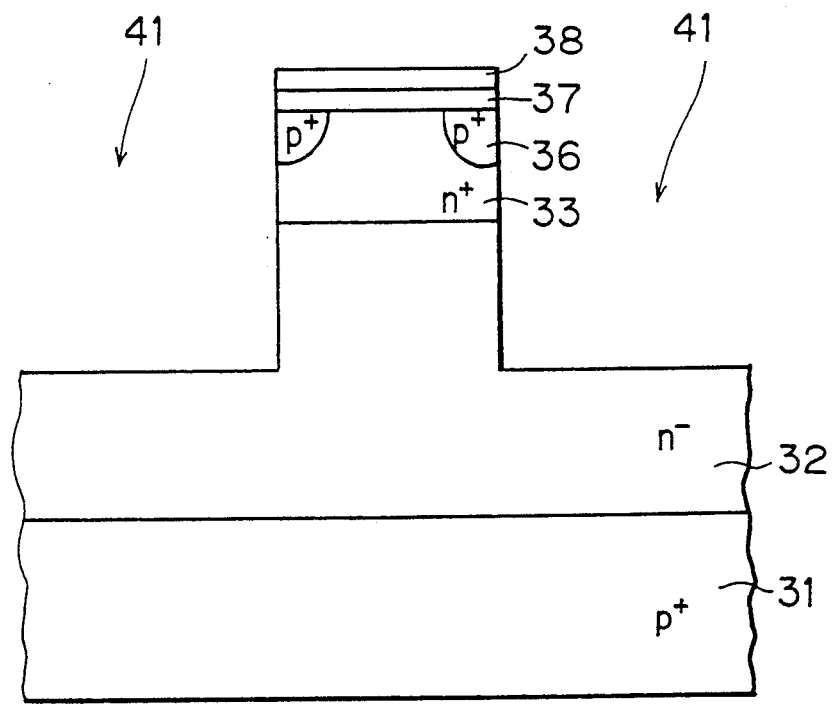

Masked with the patterned base oxide film 37 and nitride film 38, etching is performed deeply into the n− epitaxial layer 32 to selectively form trenches 41 as shown in FIG. 27. The etching may be dry or other anisotropic etching.

Figure 28:
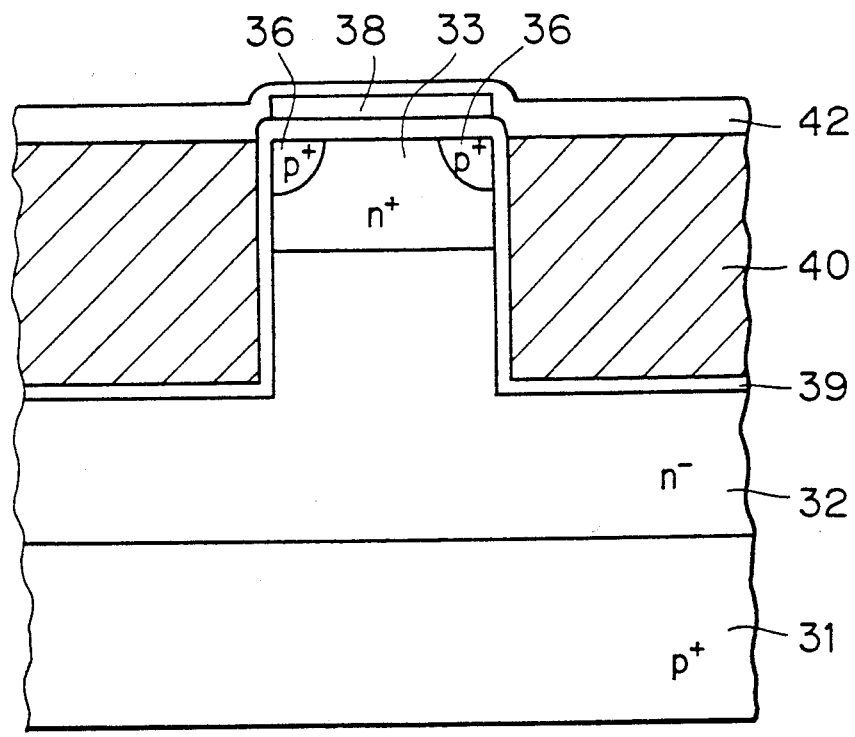

As shown in FIG. 28, a thin oxide film 39 is formed on the inner surface of the trenches 41, and polysilicon is deposited over the top surface including the inside of the trenches 41. The polysilicon is left only inside the trenches 41 by etchback to form gate electrodes 40. An oxide film 42 is formed over the top surface by thermal oxidation.

Figure 29:
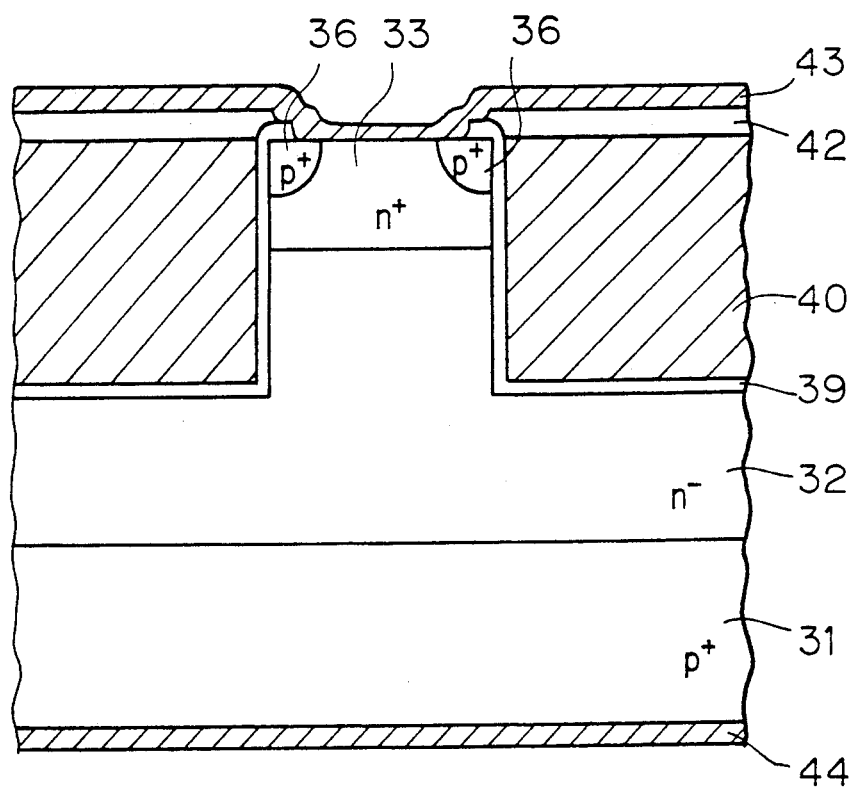
Figure 30:
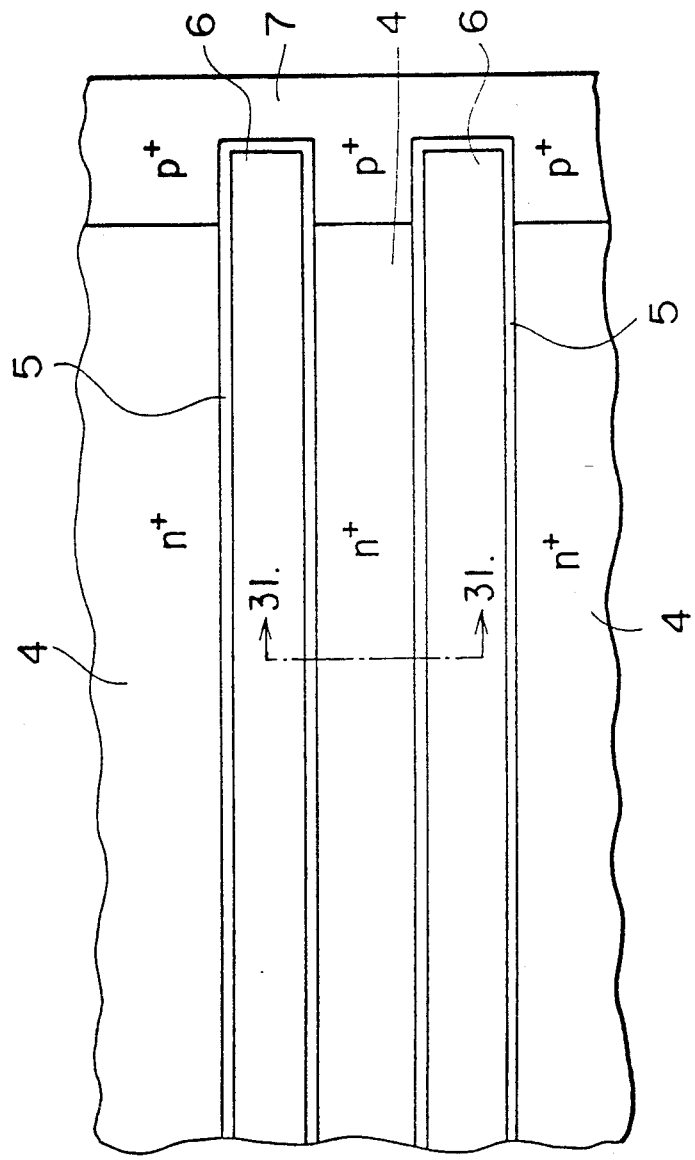
FIG. 30 is a plan view of a conventional semiconductor device.
Figure 31:
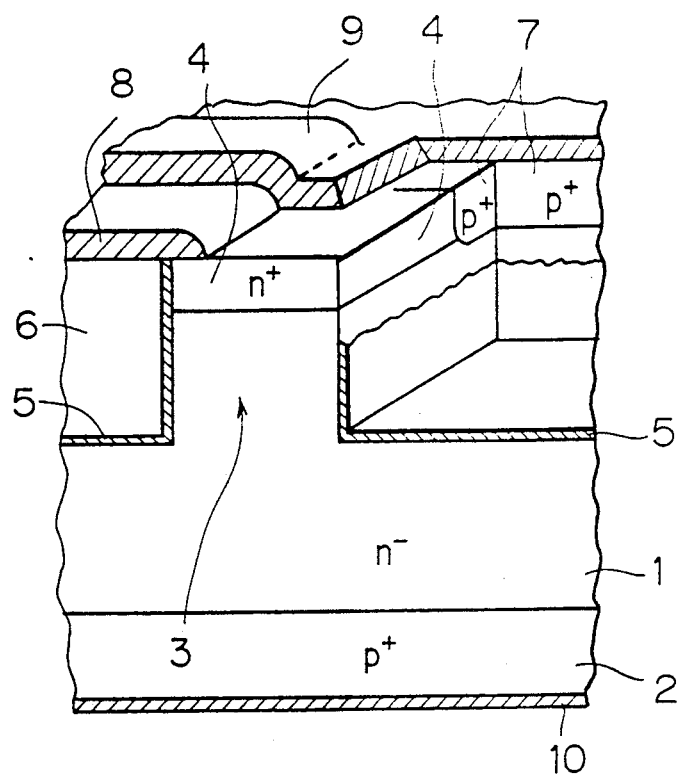
FIG. 31 is a perspective cross-sectional view taken along the line X—X of FIG. 30.
Figure 32:
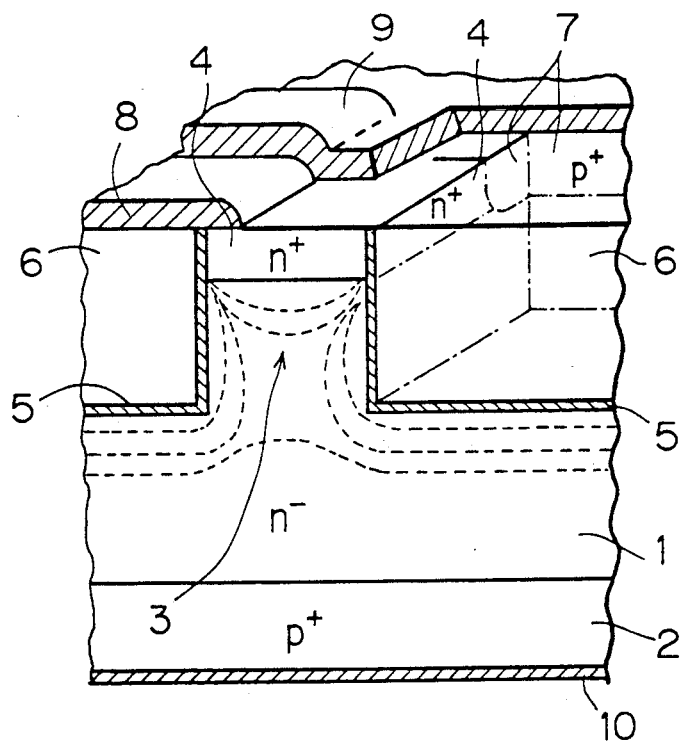
FIG. 32 is a perspective cross-sectional view showing current interruption state in the conventional semiconductor device.
Figure 33:
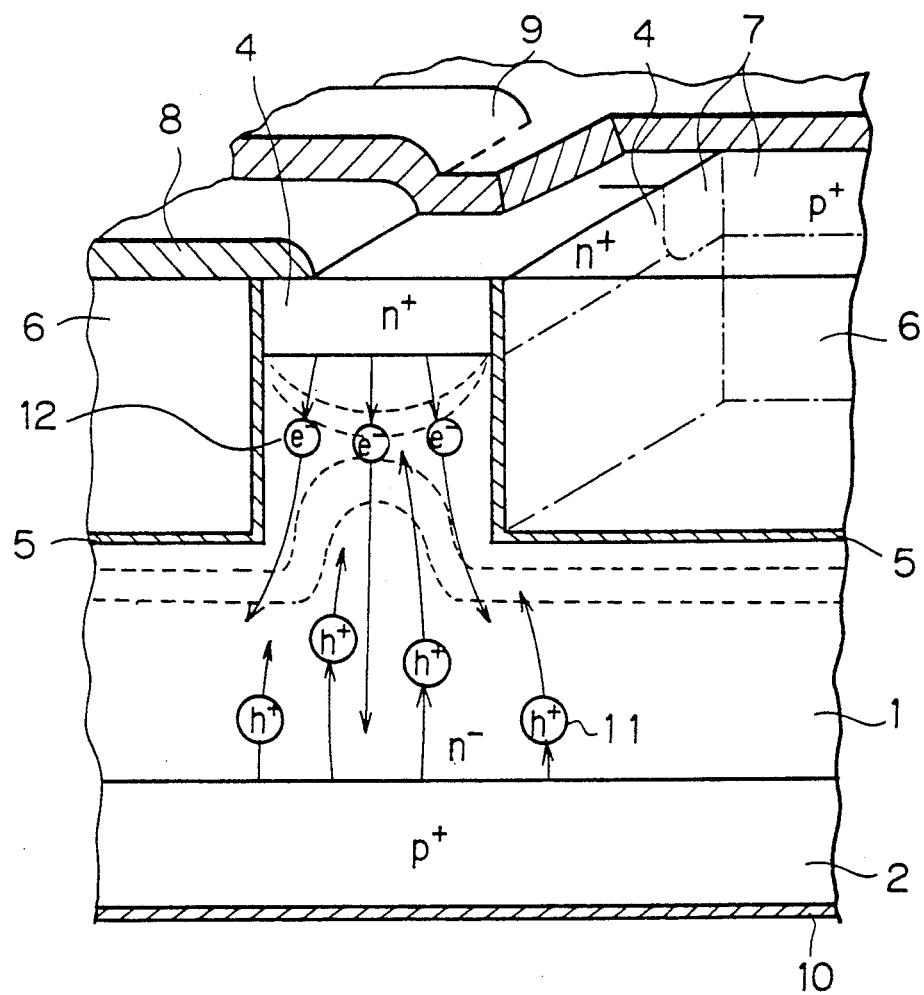
Figure 34:
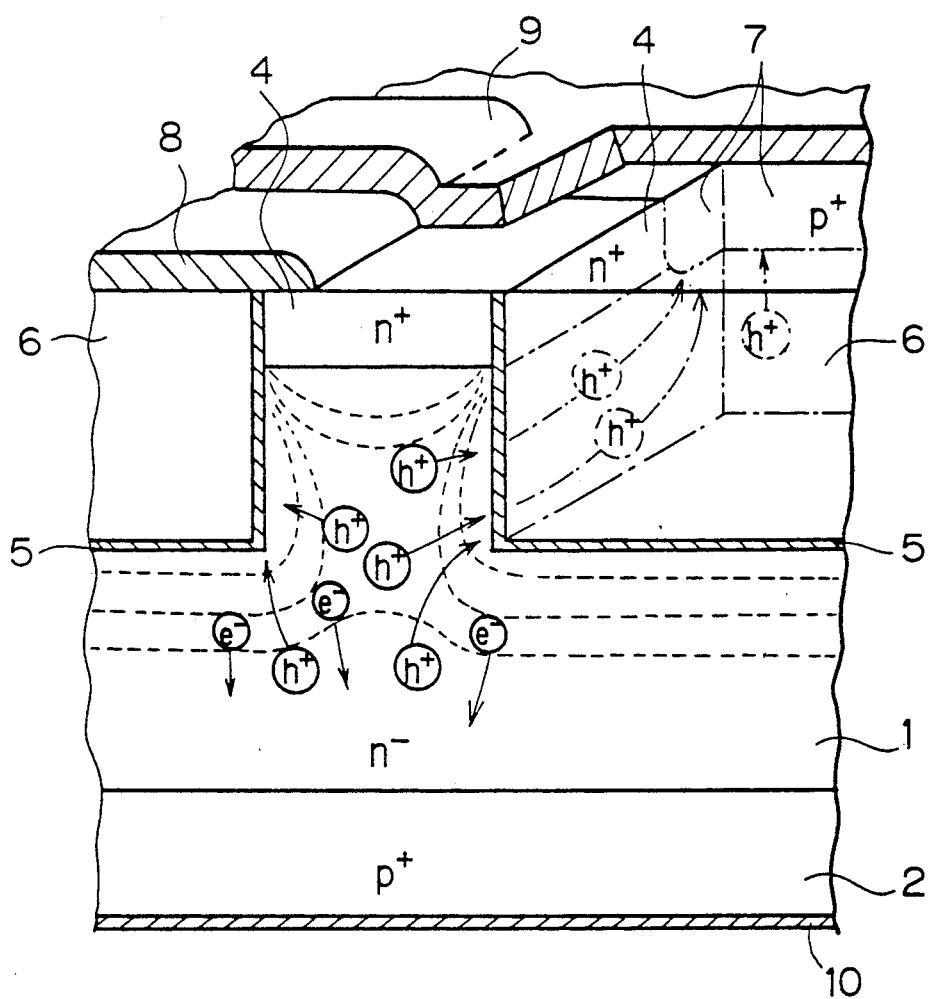
FIG. 34 is a perspective cross-sectional view of the conventional semiconductor device when it turns off.

Taking advantage of thinness of part of the oxide film 42 which lies on the nitride film 38, the oxide film 42 is etched to expose only the nitride film 38. The nitride film 38 is removed by etching. The base oxide film 37 is patterned, and Al-Si is sputter-deposited over the top surface to form an electrode 43 as shown in FIG. 29. An electrode 44 is then formed.

Figure 35:
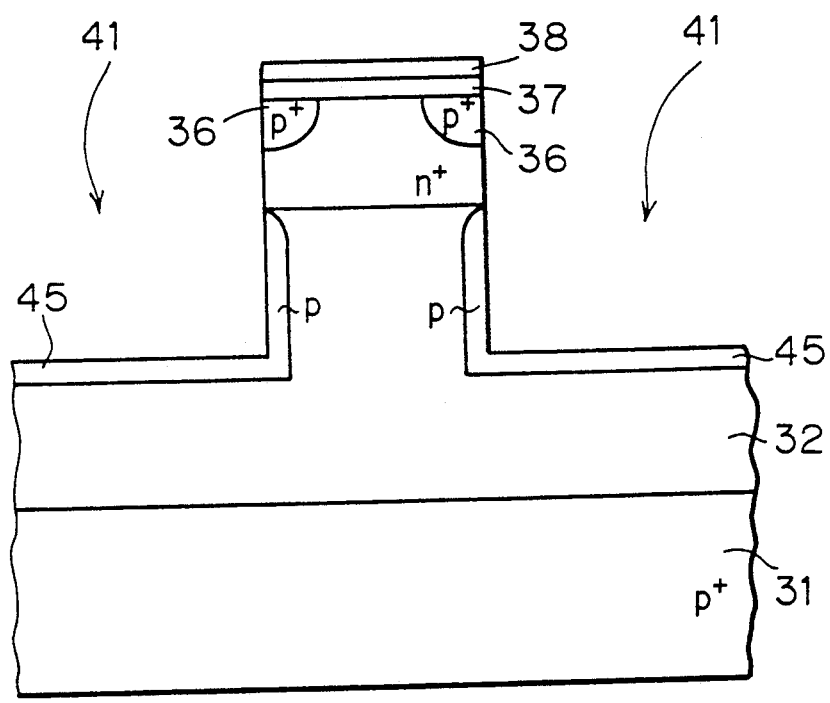
FIG. 35 is a cross-sectional view showing another process step for fabricating the semiconductor device of the present invention.

After the formation of the trenches 41 of FIG. 27, p-type impurities are diffused into the surface of the n− epitaxial layer 32 as shown in FIG. 35 to form p diffusion layers 45. The p diffusion regions 17 of FIG. 10 are thus formed without difficulty. Subsequently, the semiconductor device of the fourth preferred embodiment shown in FIG. 10 is easily formed through the same process steps as in the foregoing preferred embodiment. At this time, no p-type regions are formed in the n+ diffusion region 33 because of its high n-type impurity concentration.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a first semiconductor layer of a first conductivity type having first and second major surfaces,
   a second semiconductor layer of a second conductivity type formed on said first major surface of said first semiconductor layer,
   said first semiconductor layer including a protruding portion selectively formed on said second major surface,
   a first semiconductor region of the first conductivity type formed on the upper surface of said protruding portion and having a resistance lower than that of said first semiconductor layer,
   a first insulating film formed on one side face of said protruding portion of said first semiconductor layer and said first semiconductor region,
   a first control electrode formed on said first insulating film,
   a second insulating film formed on the other side face of said protruding portion and said first semiconductor region opposed to said one side face,
   a second control electrode formed on said second insulating film,
   a second semiconductor region of the second conductivity type selectively formed in contact with said first insulating film in a surface of said first semiconductor region, a third semiconductor region of the second conductivity type selectively formed in contact with said second insulating film in the surface of said first semiconductor region, a first main electrode formed in contact with said first, second and third semiconductor regions independently of said first and second control electrodes, and a second main electrode formed in contact with said second semiconductor layer.

2. The semiconductor device of claim 1, wherein said first and second control electrodes are electrically connected to each other.

3. The semiconductor device of claim 1, wherein said first semiconductor layer is out of contact with said second and third semiconductor regions.

4. The semiconductor device of claim 1, further comprising a fourth semiconductor region of the first conductivity type formed in contact with said second main electrode in said second semiconductor layer.

5. The semiconductor device of claim 4, further comprising a third semiconductor layer of the first conductivity type formed on said first major surface of said first semiconductor layer and having an impurity concentration higher than that of the first semiconductor layer.

6. The semiconductor device of claim 1, further comprising a fourth semiconductor region of the first conductivity type formed in contact with said second main electrode and said first semiconductor layer in said second semiconductor layer.

7. The semiconductor device of claim 1, further comprising a fourth semiconductor region of the second conductivity type formed out of contact with said second semiconductor region and in contact with said first insulating film in said second major surface of said first semiconductor layer, and a fifth semiconductor region of the second conductivity type formed out of contact with said third semiconductor region and in contact with said second insulating film in said second major surface of said first semiconductor layer.

8. The semiconductor device of claim 1, further comprising a fourth semiconductor region of the second conductivity type selectively formed out of contact with said second and third semiconductor regions on the upper surface of said protruding portion of said first semiconductor layer.

9. A semiconductor device comprising:

a first semiconductor layer of a first conductivity type having first and second major surfaces, a second semiconductor layer of a second conductivity type formed on said first major surface of said first semiconductor layer, said first semiconductor layer including a protruding portion selectively formed on said second major surface, a first semiconductor region of the first conductivity type formed on the upper surface of said protruding portion and having a resistance lower than that of said first semiconductor layer, a first insulating film formed on one side face of said protruding portion of said first semiconductor layer and said first semiconductor region, a first control electrode formed on said first insulating film, a second insulating film formed on the other side face of said protruding portion and said first semiconductor region opposed to said one side face, a second control electrode formed on said second insulating film, a second semiconductor region of the second conductivity type selectively formed in a surface of said first semiconductor region in contact with said first and second insulating films and including a plurality of independent regions spaced apart from each other along said first and second insulating films, a first main electrode formed in contact with said first and second semiconductor regions independently of said first and second control electrodes, and a second main electrode formed in contact with said second semiconductor layer.

10. The semiconductor device of claim 9, wherein said first and second control electrodes are electrically connected to each other.

11. The semiconductor device of claim 9, wherein said first semiconductor layer is out of contact with said second semiconductor region.

12. The semiconductor device of claim 9, further comprising a third semiconductor region of the first conductivity type formed in contact with said second main electrode in said second semiconductor layer.

13. The semiconductor device of claim 12, further comprising a third semiconductor layer of the first conductivity type formed on said first major surface of said first semiconductor layer and having an impurity concentration higher than that of said first semiconductor layer.

14. The semiconductor device of claim 9, further comprising a third semiconductor region of the first conductivity type formed in contact with said second main electrode and said first semiconductor layer in said second semiconductor layer.

15. The semiconductor device of claim 9, further comprising a third semiconductor region of the second conductivity type formed in contact with said first insulating film and out of contact with said second semiconductor region in said second major surface of said first semiconductor layer, and a fourth semiconductor region of the second conductivity type formed in contact with said second insulating film and out of contact with said second semiconductor region in said second major surface of said first semiconductor layer.

16. The semiconductor device of claim 9, further comprising a third semiconductor region of the second conductivity type selectively formed out of contact with said second semiconductor region on the upper surface of said protruding portion of said first semiconductor layer.

17. A semiconductor device comprising:

a first semiconductor layer of a first conductivity type having first and second major surfaces, a second semiconductor layer of a second conductivity type formed on said first major surface of said first semiconductor layer,
a first semiconductor region of the second conductivity type selectively formed on said second major surface of said first semiconductor layer,
a second semiconductor region of the first conductivity type selectively formed on a surface of said first semiconductor region and having a resistance lower than that of said first semiconductor layer,
a first insulating film formed on one side face of said first and second semiconductor regions,
a first control electrode formed on said first insulating film,
a second insulating film formed on the other side face of said first and second semiconductor regions opposed to said one side face,
a second control electrode formed on said second insulating film,
a third semiconductor region of the second conductivity type selectively formed in contact with said first insulating film on a surface of said second semiconductor region,
a fourth semiconductor region of the second conductivity type selectively formed in contact with said second insulating film on the surface of said second semiconductor region,
a first main electrode formed in contact with said second, third and fourth semiconductor regions independently of said first and second control electrodes, and
a second main electrode formed in contact with said second semiconductor layer.

18. A semiconductor device comprising:

a first semiconductor layer of a first conductivity type having first and second major surfaces,
a second semiconductor layer of a second conductivity type formed on said first major surface of said first semiconductor layer,
a first semiconductor region of the second conductivity type selectively formed on said second major surface of said first semiconductor layer,
a second semiconductor region of the first conductivity type selectively formed on a surface of said first semiconductor region and having a resistance lower than that of said first semiconductor layer,
a first insulating film formed on one side face of said first and second semiconductor regions,
a first control electrode formed on said first insulating film,
a second insulating film formed on the other side face of said first and second semiconductor regions opposed to said one side face,
a second control electrode formed on said second insulating film,
a third semiconductor region of the second conductivity type selectively formed in a surface of said second semiconductor region in contact with said first and second insulating films and including a plurality of independent regions spaced apart from each other along said first and second insulating films,
a first main electrode formed in contact with said second and third semiconductor regions independently of said first and second control electrodes, and
a second main electrode formed in contact with said second semiconductor layer.

* * * * *